US012170244B2

(12) United States Patent
Elsherbini et al.

(10) Patent No.: US 12,170,244 B2
(45) Date of Patent: Dec. 17, 2024

(54) HIGH-THROUGHPUT ADDITIVELY MANUFACTURED POWER DELIVERY VIAS AND TRACES

(71) Applicant: Intel Corporation, Santa Clara, CA (US)

(72) Inventors: Adel Elsherbini, Tempe, AZ (US); Feras Eid, Chandler, AZ (US); Georgios Dogiamis, Chandler, AZ (US); Henning Braunisch, Phoenix, AZ (US); Beomseok Choi, Chandler, AZ (US); William J. Lambert, Tempe, AZ (US); Stephen Morein, Chandler, AZ (US); Ahmed Abou-Alfotouh, Chandler, AZ (US); Johanna Swan, Scottsdale, AZ (US)

(73) Assignee: Intel Corporation, Santa Clara, CA (US)

(*) Notice: Subject to any disclaimer, the term of this patent is extended or adjusted under 35 U.S.C. 154(b) by 917 days.

(21) Appl. No.: 16/914,062

(22) Filed: Jun. 26, 2020

(65) Prior Publication Data

US 2021/0407903 A1    Dec. 30, 2021

(51) Int. Cl.
*H01L 23/522* (2006.01)
*H01L 21/768* (2006.01)
*H01L 23/532* (2006.01)
*H05K 1/11* (2006.01)
*H05K 3/14* (2006.01)

(52) U.S. Cl.
CPC .... *H01L 23/5226* (2013.01); *H01L 21/76879* (2013.01); *H01L 23/53228* (2013.01); *H05K 1/115* (2013.01); *H05K 3/14* (2013.01)

(58) Field of Classification Search
CPC ............. H01L 21/4857; H01L 23/5383; H01L 23/5226; H01L 21/76879; H05K 1/115; H05K 3/14
See application file for complete search history.

(56) References Cited

U.S. PATENT DOCUMENTS

| | | | |
|---|---|---|---|
| 9,136,196 B2* | 9/2015 | Rathburn | H01L 24/20 |
| 9,142,515 B2* | 9/2015 | Pagaila | H01L 23/552 |
| 11,527,463 B2* | 12/2022 | Cheah | H01L 23/5226 |
| 2007/0190689 A1* | 8/2007 | Kaneko | H01L 23/3114 |
| | | | 257/E21.599 |
| 2013/0100625 A1* | 4/2013 | Fujii | H05K 3/42 |
| | | | 361/783 |
| 2014/0217610 A1* | 8/2014 | Jeng | H01L 21/4857 |
| | | | 257/774 |
| 2017/0207205 A1* | 7/2017 | Kim | H01L 24/20 |
| 2019/0385977 A1* | 12/2019 | Elsherbini | H01L 25/105 |
| 2020/0083189 A1* | 3/2020 | Chen | H01L 21/565 |
| 2020/0205300 A1* | 6/2020 | Wu | H01L 21/4857 |

(Continued)

*Primary Examiner* — Jaehwan Oh
(74) *Attorney, Agent, or Firm* — Essential Patents Group, LLP

(57) ABSTRACT

An integrated circuit (IC) die package substrate comprises a first trace upon, or embedded within, a dielectric material. The first trace comprises a first metal and a first via coupled to the first trace. The first via comprises the first metal and a second trace upon, or embedded within, the dielectric material. A second via is coupled to the second trace, and at least one of the second trace or the second via comprises a second metal with a different microstructure or composition than the first metal.

17 Claims, 15 Drawing Sheets

(56) References Cited

U.S. PATENT DOCUMENTS

| | | | |
|---|---|---|---|
| 2021/0082830 A1* | 3/2021 | Lee | H01L 23/3128 |
| 2021/0098381 A1* | 4/2021 | Yu | H01L 21/4857 |
| 2021/0111129 A1* | 4/2021 | Naylor | H01L 21/76843 |
| 2021/0159193 A1* | 5/2021 | Huang | H01L 23/5383 |

* cited by examiner

HIGH-THROUGHPUT ADDITIVELY MANUFACTURED POWER DELIVERY VIAS AND TRACES

BACKGROUND

High-performance integrated circuit (IC) dies such as central and graphics processing units have increasingly larger power demands, prompting new approaches to integrated conductor architectures at package level and circuit board level. Power bottlenecks at package level may be attributed to lateral resistances due to thin traces within package power planes, vertical resistances due to limitations on the size of inter-level vias that interconnect power planes, and contact resistances between socket pins and land grid array pads on the interconnect plane of the package. To address these bottlenecks, wider and/or thicker power-carrying conductors may be fabricated to provide low-resistance paths for power circuits at package and motherboard level. For example, lateral resistances may be reduced by increasing width and thicknesses of in-plane traces. Vertical resistances may be reduced by incorporating large power vias or by advanced vertical interconnect structures such as stacked lithographic vias. Pin contact resistance may be reduced by increasing clamping forces on a CPU socket mount, adding mechanical stresses to packages, or by increasing pin size. All approaches may incur added package fabrication cost and complexity, particularly due to long process times required for electroplating thick conductors.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
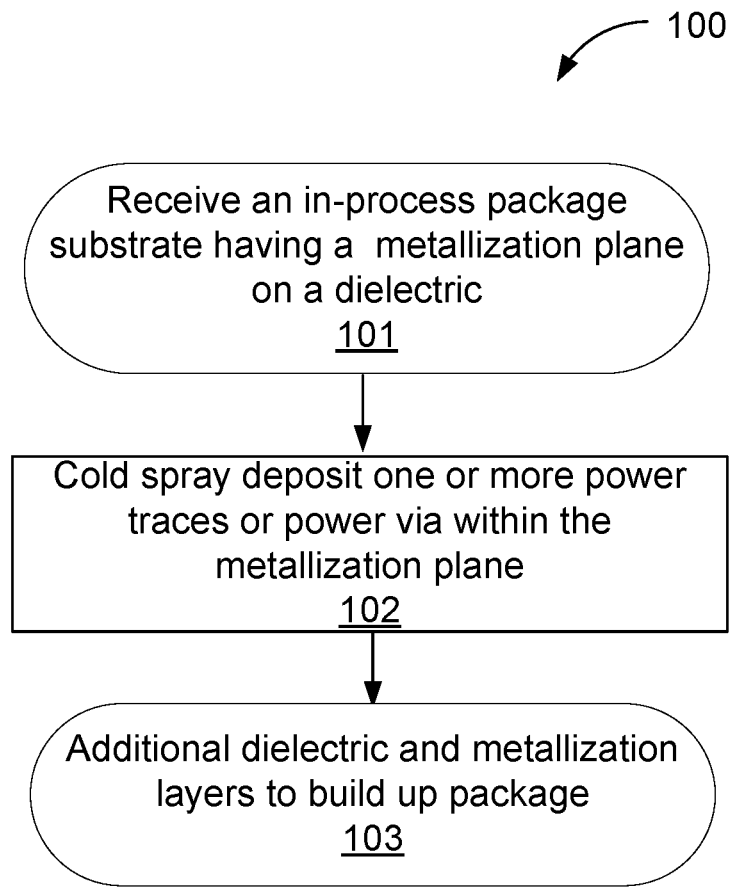
FIG. 1 illustrates a flow chart summarizing an exemplary method for making a package substrate comprising a cold-spray deposited power trace, according to some embodiments of the disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Here, the term "circuit" or "module" may refer to one or more passive and/or active components that are arranged to cooperate with one another to provide a desired function. The term "signal" may refer to at least one current signal, voltage signal, magnetic signal, or data/clock signal.

Here, the term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to a printed circuit board (PCB).

The meaning of "a," "an," and "the" include plural references. The meaning of "in" includes "in" and "on." The vertical orientation is in the z-direction and it is understood that recitations of "top", "bottom", "above" "over" and "below" refer to relative positions in the z-dimension with the usual meaning. Generally, "top", "above", and "over" refer to a superior position on the z-dimension, whereas "bottom", "below" and "under" refer to an inferior position on the z-dimension. The term "on" is used in this disclosure to indicate that one feature or object is in a superior position relative to an inferior feature or object, and in direct contact therewith. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Described herein is an IC package substrate comprising three-dimensionally structured low-resistance power conductors such as traces and via interconnects. The low resistance power conductors may be fabricated at least in part by high-throughput additive manufacturing (HTAM) deposition processes such as cold spray deposition, capable of creating metallic features to thicknesses ranging from several hundred microns to several millimeters over large areas of a substrate within seconds. HTAM metallization features may be formed by cold spray deposition through a shadow mask or by direct-write methods employing mobile or stationary micronozzles.

Some embodiments of such power conductors comprising the afore-mentioned HTAM metallization include power traces comprising a thick (e.g., >100 um) metallization layer formed by HTAM cold-spray deposition of a suitable metal over a thinner (e.g., <30 um) layer of electroplated copper (e.g., an electroplated power trace in a conductor plane) as a supplemental material. "HTAM metallization" and "supplemental material" may be used interchangeably in this disclosure.

While the composition and microstructure of the supplemental material may be the same or differ from the composition of the underlying electroplated copper trace, the resistivities of both layers may be substantially the same. The HTAM metallization supplements the electroplated copper as a conductor, forming a hybrid power trace with added z-height and cross-sectional area (widths of both layers may be substantially the same). Thus the resistance of the hybrid power trace may be substantially reduced relative to the resistance of an electroplated trace of the same length and width.

In some embodiments, the HTAM metallization may extend vertically into an overlying metallization plane. To avoid interference with signal and/or power routing within the overlying metallization plane, some embodiments of the hybrid power trace may have thick hybrid segments interspersed between thin electroplated or subtractively etched segments. Signal and/or power routing in the overlying metallization plane may be distributed in groups of traces crossing orthogonally over the electroplated segments confined to the lower plane between the thicker hybrid segments. While the overall resistance of a segmented hybrid power trace is somewhat greater than one without segmentation, it may still be significantly lower than an electroplated power trace. The overall resistance of the segmented power trace is significantly lowered relative to the electroplated thin trace of the same width and length.

Other embodiments of HTAM power conductors include large power vias. While such vias may be fabricated by electroplating, distances between power planes may be 100 microns or greater. Plating times to create large vias may take up to one hour to fill a via hole that is up to several hundred microns deep, whereas cold spray deposition of a supplemental material into a large via hole may require only seconds to fill the hole. Thus cold spray deposition may deposit HTAM metallization at rates that are orders of magnitude faster than metal deposition by electroplating. High-throughput fabrication of large power vias that have z-heights and diameters ranging up to 500 um or more is thus enabled by cold spray deposition.

The HTAM power vias may interconnect two or more conductor planes embedded within the package substrate dielectric several hundred microns apart, or may interconnect a surface conductor plane to an embedded conductor plane (deep within the substrate).

Some embodiments of the IC package substrates comprising the HTAM metallization power structures include HTAM three-dimensional power pin contact pads to increase contact area with socket pins, thus lowering pin contact resistance. HTAM contact pads may have a non-planar contact surface shaped by an HTAM process 3D direct-write cold spray deposition to complement the three-dimensional contours of power contact pins that may include expanded tips or extra structures for inserting into the three-dimensional contact pads. An exemplary embodiment of such a three-dimensional contact pad comprises conical recesses or cavities to complement socket pins having conical tips or caps on socket power pins inserted into the conical recesses. In other embodiments, other surface shapes are possible, including round recesses to receive curled or hemispherical pin tips. Fine structuring of the HTAM metallization may be achieved by a direct-write cold spray method, whereby mobile micronozzles or a stationary micronozzle array may be employed.

In some embodiments, surface finish comprising a layer of a soft malleable conductive material covers pin receiving portions of the contact surfaces of the three-dimensional HTAM power contact pads. The conductive malleable material may further increase contact area and reduce contact resistance by plastically deforming under pressure when encountering a socket pin, causing the extra material of the malleable layer to extrude and mold around the tip of the contact pin, filling any gaps between the contact pad and pin with conductive material. The contact resistance between pin and three-dimensional contact pad may be further lowered by the presence of the malleable layer.

An example of a conductive malleable material is gold, silver, aluminum, zinc, indium, gallium, iron, tin or an alloy comprising any of the afore-mentioned metals and other materials not listed. A suitable malleable material may in general have a bulk modulus that is lower than that of the supplemental material. A thick film of conductive malleable material may be coated onto the HTAM power contact to a thickness of 10 to 100 microns by second cold spray or other type of deposition of a powder, vapor or plasma comprising one or more of the afore-mentioned materials, for example.

In some embodiments, a conductive liquid metal is confined within recesses on the HTAM power contact pads. The conductive liquid metal may comprise materials such as gallium, indium, tin, and eutectic alloys comprising any of the afore-mentioned materials and materials not listed. A suitable liquid metal may have a melting temperature between −20° C. and +25° C. The liquid metal coating may wet the three-dimensional surface of the HTAM power contacts for adhesion by surface tension. The thickness of the coating may vary between 10 and 100 microns. For example, the liquid metal may partially fill recesses on the three-dimensional surface of the HTAM power contact pad. Socket pin tips may be shaped to increase surface area immersed into the liquid metal coating when pressed against the HTAM power contact pad. The liquid metal may spread over the socket pin tip under shear stress during insertion of the socket pin tip, and may flow over portions of the pin that may not be in physical contact with the HTAM power contact pad, such as the pin shaft or underside of a pin extension structure. Substantially more surface of the pin may be accessed by the liquid metal to significantly increase contact area between the power socket pin and the HTAM power contact pad. The contact resistance relative to a flat contact pad may be reduced in inverse proportion to the increase in contact area.

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1 illustrates flow chart 100 summarizing an exemplary method for making a package substrate comprising a cold-spray deposited power trace, according to some embodiments of the disclosure.

At operation 101, a partial package substrate is received in-process for fabrication of low-resistance power traces by an HTAM cold spray process, according to some embodiments. The as-received package substrate may comprise an electroplated metallization plane formed over a dielectric material in a previous operation. The metallization pattern may comprise integrated signal and/or power routing, the latter comprising conductors such as traces and pads that may generally be larger than signal routing conductors that carry small signals.

In some embodiments, the as-received package substrate comprises at least one layer of a dielectric material having an associated metallization plane formed over the dielectric layer. In substrates having multiple layers, multiple metallization planes may be embedded within the dielectric material, with a top metallization plane at the top of the as-received package substrate. A conductor plane may be between each dielectric layer (in some embodiments, multiple dielectric layers may be present between metallization planes). The as-received package substrate may be formed by a build-up process whereby dielectric material is deposited or laminated one layer at a time. The dielectric material may include an organic film laminate or liquid resins (including ceramic composites) that may be molded into individual layers. An electroplated metallization plane may be formed over each dielectric layer, after which a new dielectric layer is added over the metallization plane. The dielectric layer thickness may range between 10 and 100 microns. The metallization plane may comprise copper having a thickness ranging between 5 and 40 microns and may be formed by semi-additive electrodeposition (e.g., of copper).

As the in-plane conductor thicknesses may be limited to 40 microns or less, traces may be widened to an extent to reduce resistive losses by increasing the cross-sectional area of the conductor. The extent to which the conductor may be widened may be restricted by routing density and package dimension considerations. Large currents may also be divided among multiple power carrying traces within a single plane and also within adjacent planes to reduce resistive losses, possibly at the expense of increased layer count within a package substrate.

Increasing the vertical dimensions of in-plane conductors by layering HTAM metallization over the electroplated features may enable a substantial increase in cross-sectional area relative to the electroplated features by themselves. HTAM metallization may enable formation of thick in-plane features without entailing a significant increase in layer count or in lateral dimensions of the package. Electroplated power traces having thicknesses of 10-30 microns may be thickened to z-heights of 400 or 500 microns by HTAM metallization.

In a multi-level package substrate, HTAM metallization may include large power vias that extend multiple levels from the surface of the substrate into the interior, connecting one or more embedded metallization planes to the in-process plane. The power vias may have large diameters spanning to several hundred microns, (in some embodiments approximately equal to their z-height). In some embodiments, a HTAM power via is formed between two embedded conductor planes. In other embodiments, a HTAM power via extends from a land or die interconnect plane to an intermediate power plane. The HTAM power via may be integral with a power connector pad.

At operation 102, low resistance power traces may be formed within the electroplated conductor plane at the top of the substrate. Supplemental material may be cold sprayed over electroplated copper traces to form low-resistance power traces. The low resistance power traces may be capable of conducting high dc currents with minimal loss relative to conventional electroplated traces. Each low resistance power trace may comprise a thick (e.g., 100-400 microns) coating of the supplemental material stacked over the electroplated copper layer.

While the composition of the supplemental material will be described below in greater detail, the supplemental material may be derived from a copper-containing powder, for example. The powder particles may comprise pure copper (e.g., >99% Cu), or comprise a copper composite such as, but not limited to, a copper-graphene composite. Cold spray deposition is capable of depositing compact fused particle metal layers at rates of hundreds of microns per second. Structures formed by cold spray powder deposition may have a microstructure that is substantially different from electroplated structures. Contrasted with electroplating, structures formed by cold spray deposition may have a small but measurable percentage of interstitial voids. For example, void area as measured in cross-sectional micrographs may be between 0.1% to 0.5%. Powder particles may deform to elongated grains upon impact, forming structures resembling lamellae. During deposition, successive particles may strike the same location, forming lamellar stacks. The microstructure of structures formed by cold spray power deposition is described below.

The HTAM metallization layer feature formed on the copper trace may vertically overlap adjacent conductor planes and may interfere with signal and/or power routing within those planes. To avoid significant overlap with adjacent conductor planes, HTAM metallization may be deposited along portions of the power traces instead of completely covering the trace, forming segments of thick HTAM metallization along the copper trace that are separated by gaps. By including open portions, signal and/or power conductors in adjacent metallization planes may pass between the HTAM metallization features, mitigating the need to increase package z-height in order to accommodate the thicker conductors. The overall resistance of the segmented power trace may be increased slightly relative to a HTAM power trace comprising a continuous layer of supplemental material.

Optionally, one or more large power vias may be fabricated by cold spray deposition of a supplemental material into holes formed at least partially through the substrate (e.g., by laser drilling). Due to the rapid deposition rates that may be achieved by cold spraying, large HTAM power vias having z-heights and diameters several times those of conventional electroplated vias may be readily formed. Accordingly, the large power vias may have z-heights of hundreds of microns, partially or fully spanning the entire thickness of the package substrate to interconnect power planes separated by multiple levels of conductor planes. In some embodiments, the large power vias may replace stacks of microvias employed for vertical power interconnects in conventional substrate metallization.

At operation 103, the partially complete package substrate stack may undergo further processing. After completion of the HTAM power traces or HTAM via, the package substrate may be returned to process line where further processing may include further addition of dielectric and metallization planes to the package substrate as well as planarization and/or annealing steps. At a later stage of processing, the package substrate may be received again into the HTAM process for addition of further HTAM metallization.

FIGS. 2A-G illustrate operational cross-sectional views in the x-z plane of an exemplary method as outlined in FIG. 1 for fabricating package substrate 200 comprising HTAM low-resistance power traces, according to some embodiments of the disclosure.

Figure 2A:
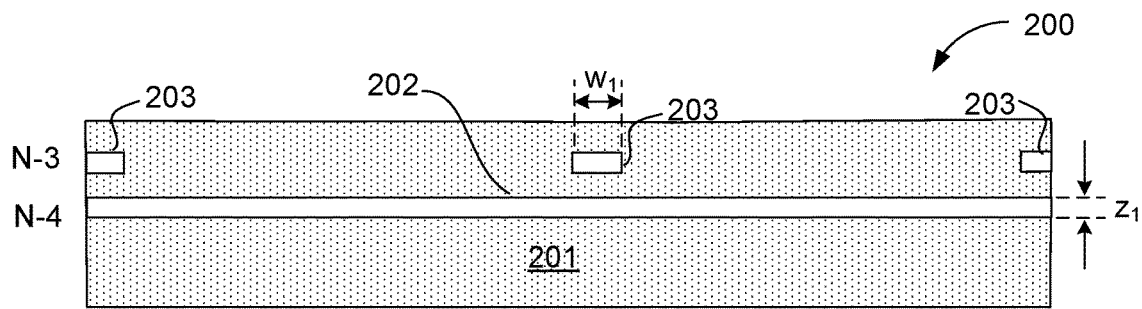
FIGS. 2A-G illustrate operational cross-sectional views in the x-z plane of an exemplary method as outlined in FIG. 1 for fabricating a package substrate comprising HTAM low-resistance power traces, according to some embodiments of the disclosure.

Referring to FIG. 2A, package substrate 200 is received into a HTAM cold spray deposition process. In the illustrated embodiment, package substrate 200 comprises conductor planes N-3 and N-4 comprising traces 202 and 203, respectively) embedded within dielectric 201. Conductor planes N-4 and N-3 are part of a multilevel stack of conductor planes within package substrate 200, which may include more conductor planes below level N-4 (e.g., N-5, N-6, etc. with increasing depth, not shown). Conductor plane N-3 and those planes below N-3 may have been formed in previous electroplating operations. The lowest conductor plane may be on a lower surface of dielectric 201.

Package substrate 200 may be formed by a cored or coreless build-up layer process. In some embodiments, dielectric 201 is a single layer of dielectric (e.g., a dielectric laminate) having a thickness between 10 and 100 microns. In some embodiments, dielectric 201 is part of multilayer package stack comprising multiple dielectric layers, where only the top portion of the package is shown in the figure. In some embodiments, dielectric 201 may comprise multiple layers of an organic laminate, each laminate layer having thicknesses ranging between 10 and 100 microns. While dielectric layer boundaries may coincide with conductor levels, multiple layers of dielectric may be between conductor planes. In some embodiments, dielectric 201 comprises a molded resin (e.g., an epoxy) or ceramic composite.

Metallization features such as traces 202 and 203 within conductor planes N-4 and N-3, respectively, may be formed by electroplating copper over dielectric 201 to thicknesses up to 40 microns. Semi-additive electroplating processes may include plating through lithographically-defined openings in a photoresist mask. Another example of a copper electroplating process is a dual damascene process, whereby lithographically-defined trenches and holes are etched in the dielectric material (e.g., dielectric 201) and backfilled by electroplated metal (e.g., copper) to form metallization features. Trace 202 may be interconnected to pads and other traces within conductor plane N-4. In multilevel package substrates, trace 202 may also be vertically interconnected to adjacent conductor planes by vias (described below). Vias may be built up by electroplating the portions of the vertical structure in successive dielectric layers. Electroplating is generally an atomic deposition process. Copper may be deposited at rates of 5 microns per minute or less. Furthermore, the rate of electroplating may be and is often reduced by lowering the current (e.g. amperes per square meter of panel or wafer area) to achieve better plating uniformity, support higher via aspect ratios, achieve longer plating bath life before needing to replace and/or favorable copper microstructure across the panel or wafer. Depending on the process conditions, electroplated copper can have a highly compact microstructure having substantially no measurable void area.

Conductor plane n-3 may be a signal plane, comprising traces 203 that generally carry small signal data I/O. Each one of traces 203 may be representative of multiple signal traces that are part of signal routing in conductor plane N-3. Traces 203 may extend substantially orthogonally to trace 202. Conductor plane N-4 may be a power plane, comprising power conductors similar to trace 202, and may have a larger critical dimension than signal carrying traces 203. For example, trace 202 (and other power carrying conductors) within may have a greater thickness and/or width than traces 203 (having width w1) to increase cross sectional area, reducing resistance.

Figure 2B:
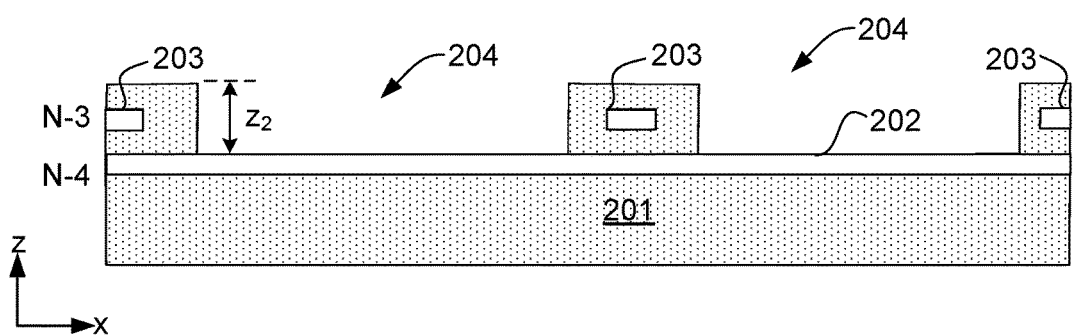

Referring to FIG. 2B, one or more openings 204 may be formed within dielectric 201 for backfilling with HTAM metallization (described below). Openings may be formed by a drilling or etching process in dielectric 201. Openings 204 may extend laterally (in the x-dimension) over a significant portion of trace 202. For example, openings 204 may extend several millimeters along trace 202. While multiple openings 204 are shown in the illustrated embodiment, a single opening 204 extending along substantially the entire length or a portion of the length of trace 202 may be formed, according to some embodiments. Openings 204 may have z-heights ranging between 100 and 500 microns. Laser drilling may be employed to form openings 204 to the depth of trace 202, where trace 202 may be exposed and form the bottom of the openings. Alternatively, a deep reactive ion etching (DRIE) process may be employed to form openings 204 chemically. An etch mask may define lateral shape and dimensions of openings 204, which may be etched to the depth of trace 202. The side walls of the dielectric may be substantially vertical or slanted depending on the type of process used to remove the dielectric.

Figure 2C:
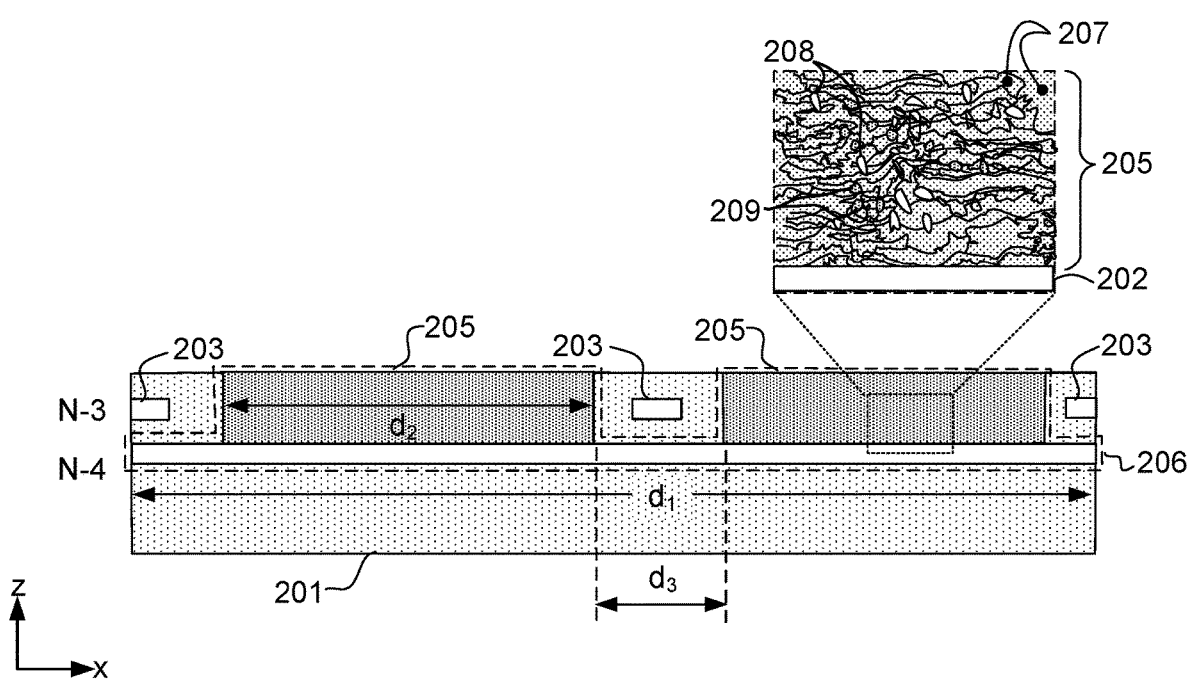

Referring to FIG. 2C, low-resistance HTAM power conductors 206 (delineated by the dashed outline) may be formed by cold-spraying a conductive supplemental material within openings 204, forming relatively thick HTAM metallization structure(s) 205 over copper traces 202. The supplemental material may comprise malleable and/or ductile materials such as, but not limited to, copper, aluminum, iron, silver, gold, nickel, titanium, vanadium, and indium and alloys comprising any of the afore-mentioned metals and other metals not listed here. HTAM metallization structures 205 may form metallic bonds with the underlying electroplated copper layer, whereby HTAM metallization structure 205 and copper trace 202 are united in a single power conductor (e.g., low resistance power conductor 206). In some embodiments, HTAM metallization structure 205 has a composition that is substantially the same as trace 202. As an example, both trace 202 and the HTAM metallization structure 205 may comprise 99% copper. In some embodiments, HTAM metallization structure 205 may have a composition different from that of the electroplated trace 202. As an example, HTAM metallization structure 205 may comprise aluminum or a composite of copper and graphene, whereas trace 202 comprises 99% bulk copper.

Despite compositional and microstructural differences between HTAM metallization structure 205 and trace 202, the layers may have similar resistivities. Trace 202 may be supplemented by HTAM metallization structure 205, having substantially the same electrical characteristics. Due to the relatively large thickness (e.g., 100-500 microns) of the HTAM metallization layer (e.g., HTAM structure 205), the hybrid HTAM power trace 206 has an increased z-height and larger cross-sectional area than trace 202. Thus HTAM metallization structure 205 may afford significant reduction of its overall electrical resistance relative to a copper trace alone. The reduction in resistance may be substantially equal to the ratio of layer thicknesses (e.g., the ratio of HTAM metallization structure 205 thickness to copper trace 202 thickness ranging between 10 and 50 microns). HTAM power trace 206 may carry many times more current than trace 202 alone without incurring power losses. Furthermore, this may allow trace 202 to have thinner metallization with the remaining thickness being provided by the HTAM process. This may allow lower electroplating cost and may enable the layer N-4 to support smaller feature sizes (e.g. for input/output signals breakout) which can help reduce the number of layers in the package and thus enabling further cost reduction and thinner packages.

Referring again to FIG. 2C, one or more HTAM metallization structures 205 having a length $d_2$ is/are distributed along low resistance power trace 206. In the illustrated embodiment, low-resistance power trace 206 has a total length $d_1$ (e.g., the length of copper trace 202) that may be several times $d_2$. As shown in the illustrated embodiment, HTAM metallization structures 205 extend vertically through upper adjacent plane N-3. To minimize interference with signal routing in conductor plane N-3, multiple HTAM metallization structures 205 may be separated from each other by a distance $d_3$. The distance $d_3$ may be determined in part by locations and orientation of signal traces in adjacent conductor planes. For example, traces 203 are orthogonally-routed (e.g., in the y-dimension) relative to low resistance power trace 206 in conductor plane N-3.

In some embodiments, overlap with metallization in adjacent conductor planes may not be significant. HTAM metallization structure 205 may be continuous along trace 202, spanning a large fraction or substantially all of the length $d_1$. For example, HTAM metallization structure 205 may have a length $d_2$ that is within at least 20% of $d_1$.

As noted above, supplemental material may be derived from a powder comprising a ductile and/or malleable material such as those noted above. While the supplemental material may also comprise substantially the same purity of copper as the trace 202, the supplemental material may exhibit a substantially different microstructure than that of electroplated copper.

During the cold spray process, metallic powder particles are entrained in high-speed gas jets directed towards a substrate surface at high velocity. The energy transfer upon impact with the substrate may cause local heating at the point of impact. A rapid rise in temperature above the melting point of the impacting particle and impact surface may ensue, causing some superficial melting of the particle-surface impact point, enabling particle adhesion by fusion bonding from adiabatic heating. The local heating may cause momentary superficial melting and fusing or sintering together of adjacent particles into the supplemental material. Continuous particle impact upon the top surface of the growing cold-spray feature may build up stacks of lamellae formed by particles flattened by plastic deformation. The agglomeration of lamellae and lamellar stacks builds up the supplemental material.

As noted above, the cold spray process may rapidly deposit supplemental material at rates of tens or hundreds of microns per second. Such high deposition rates may enable high-throughput manufacturing of hundreds or thousands of HTAM metallization structures 205 (in hundreds or thousands of substrates) per hour. This processing rate may be contrasted to formation of similar structures by electroplating, which may require hours of process time as described below.

The inset of FIG. 2C shows a magnified cross-sectional view of HTAM power conductor 206. HTAM metallization structure 205 may exhibit a microstructure that includes large lamellae 207 (typically 50 to 1000 microns, depending on powder) or stacks of lamellae, formed by impacted particles. Lamellar stacks may be formed by impact of primary particles, where most of the primary particles plastically deform by elongation and flattening on impact (e.g., splat). Particles may impact each other in succession, forming stacks of contiguous irregular or regular-shaped lamellae 207. In some embodiments, individual lamellae 207 are delineated by discernable boundaries, which may be observed at magnifications below 500×. In some embodiments, lamellae 207 are not distinguishable at the indicated magnifications. Lamellar boundaries may be amorphous due to fusion bonding of lamellae.

Lamellae 207 may have irregular shapes, causing interstitial voids 208 to appear at lamellar boundaries. In some embodiments, intact or mildly deformed primary particles 209 may be embedded within the lamellar matrix. Intact primary particles may displace lamellae in stacks, or embed at lamellar boundaries.

Interstitial voids 208 (e.g., between lamellae 207) may be present in the microstructure of the supplemental material. Void areas ranging from 0.1% to 0.5% or greater may be typical of materials formed by cold or thermal spray processes.

The existence of voids, particularly within the supplemental material bulk, is indicative of the supplemental material features having been formed by an HTAM process, such as spray deposition (e.g., a cold spray process). Voiding area is generally a well-characterized quality control parameter that can be monitored in spray deposition processes. The microstructure may also include embedded powder particles 209 that are quasi-spherical, having substantially retained their original shape after impact.

Referring again to the inset, the microstructure of the supplemental material of HTAM metallization structures 205 is contrasted with the compact microstructure of an electroplated copper (e.g., trace 202) layer. The electroplated layer may exhibit substantially zero measurable void percentage as shown. HTAM metallization structures 205 may also have a significant surface roughness as an extension of the coarse granular nature of the supplemental material. HTAM metallization structures 205 may exhibit an average surface roughness of several microns. As an example, HTAM metallization structures 205 may have an average surface roughness of 10 microns or greater. The surface roughness may be observed in microscopic cross section on the top surface of the HTAM metallization structures 205 and may be present at interfaces with sidewalls of trenches 204. In contrast, electroplated copper may exhibit an average surface roughness of less than 1 micron.

Figure 2D:
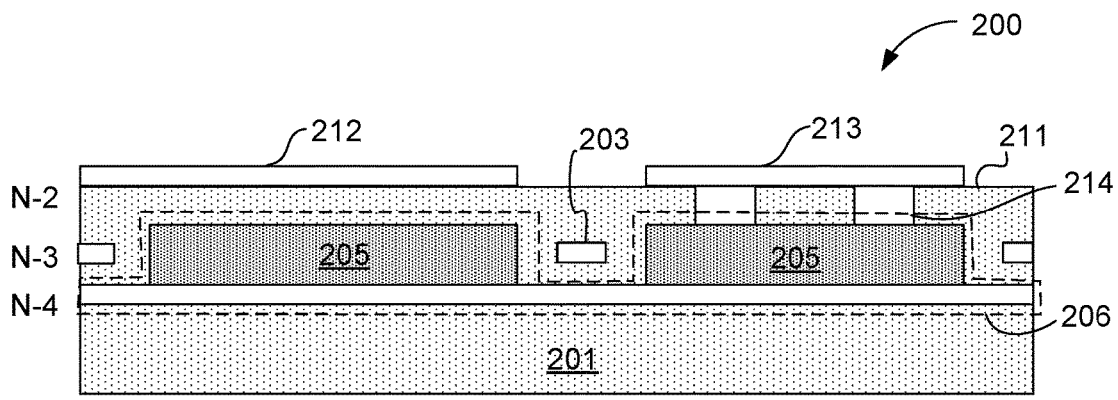

Referring to FIG. 2D, package substrate 200 has undergone further build-up to include conductor plane N-2 formed on layer 211 comprising dielectric 201, embedding HTAM metallization structure(s) 205 below conductor plane N-2. Conductor plane N-2 may comprise damascene copper metallization, including trace 212 and pad 213. In the illustrated embodiment, vias 214, (e.g., electroplated in a dual damascene operation forming N-2 conductors interconnect low resistance power trace 206 to pad 213 in N-2.

Figure 2E:
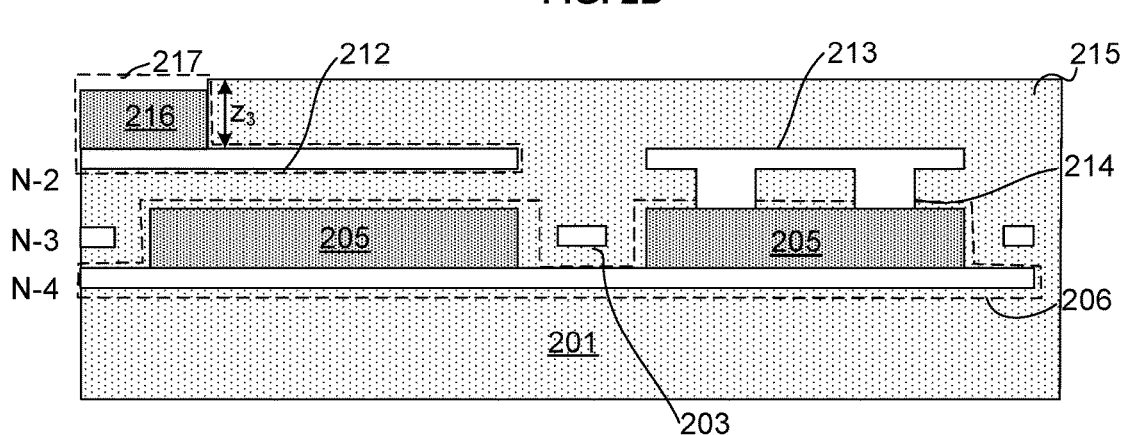

Referring to FIG. 2E, layer 215 of dielectric 201 is formed over conductor plane N-2. In some embodiments, layer 215 comprises multiple layers of dielectric. HTAM metallization structure 216 may be formed by cold spraying a supplemental material to a depth z3 within an opening (not shown) made in the dielectric (e.g., in layer 215) previous to the cold spraying operation. HTAM metallization structure 216 may be a thick HTAM layer over trace 212, forming a second low-resistance power rail 217 in conductor plane N-2.

Figure 2F:
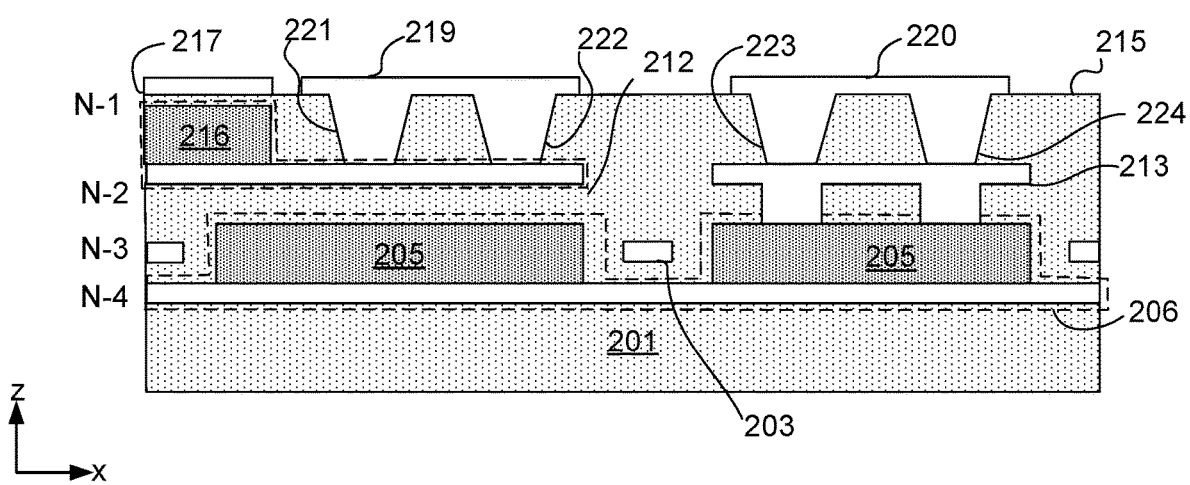

Referring to FIG. 2F, conductor plane N-1 is formed by electroplating conductor features on dielectric layer 215. Conductor features comprise landing pads 219/220 and associated vias 221 and 222 for landing pad 219 and vias 223 and 224 for landing pad 220, respectively. Conductors may be formed by a semi-additive electroplating process as illustrated in FIG. 2F for example, whereby vias are drilled using mechanical or laser process in dielectric layer 215, a photoresist is deposited, exposed and developed; then copper is electroplated. Lithographically-defined microvia holes may be desired in high density signal routing metallization planes as via dimensions can be more precisely patterned than creating via holes by laser drilling or mechanical drilling.

Preceding the electroplating operation, a suitable dielectric removal process such as laser drilling, mechanical drilling or DRIE to form via holes may be employed. For example, via holes may be formed by laser drilling openings to depth $z_3$, (e.g., $z_3$ is 100 microns or less) exposing portions of trace 212 and landing pad 213. For purposes of power conveyance between conductor planes, multiple adjacent via sets (e.g., vias 221/222 and 223/224) may be combined in parallel. For example, vias may be electrically coupled in parallel by electroplating vias 220 and 221 together on trace 212 and integrally formed with landing pad 219. Likewise, via 222 together with via 223 may be grown on landing pad 213 and be integrally formed with landing pad 220.

Figure 2G:
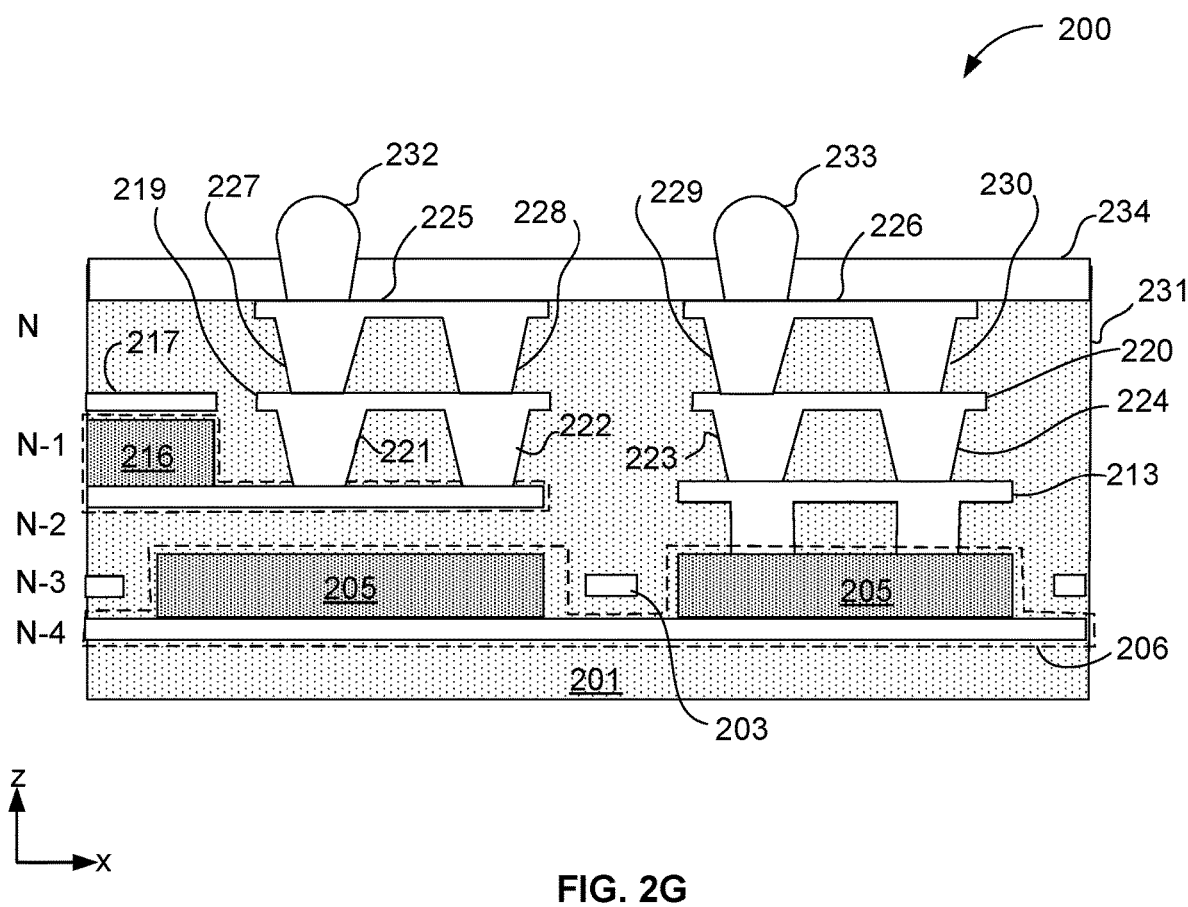

Referring to FIG. 2G, contact pads 225 and 226 are formed in a second dual damascene electroplating operation as part of the metallization in conductor plane N, the top conductor plane of package substrate 200. Contact pads 225 and 226 may be land pads. Via pairs 227/228 and 229/230 are formed in the dual damascene process, plated into via holes made in top dielectric layer 231. Via pairs 227/228 and 229/230 forming via stacks with lower via pairs 221/222 and 223/224, respectively, coupling low resistance power traces 206 and 217 to contact pads 225 and 226. In the illustrated example, solder bumps 232 and 233 are added through openings in solder resist mask 234 formed over pads 225 and 226. Low resistance power traces 206 and 217 may be employed as power rails coupled to a ball grid array comprising solder balls 232 and 233, for example.

Multiple via stacks may be employed to interconnect power planes separated by several dielectric layers. As noted above, inter-plane via interconnects may be plated at rates of up to approximately 300 microns per hour. For example, a 150 micron high via may require more than 30 minutes to plate. In addition, it may end up consuming the bath chemicals used to ensure uniform and planarizing plating which requires replacing the bath significantly more often, thus affecting the plating cost and throughput time. Additionally, many standard plating solutions cannot support such high plating rates while maintaining sufficient uniformity across the panel/wafer. In such cases, formation of electroplated features that have thicknesses of 100 microns or more may take significant time to complete. Alternatively, power via holes having larger diameters and z-heights than via holes may be drilled by mechanical or laser drilling, and rapidly backfilled by HTAM metallization.

Figure 3:
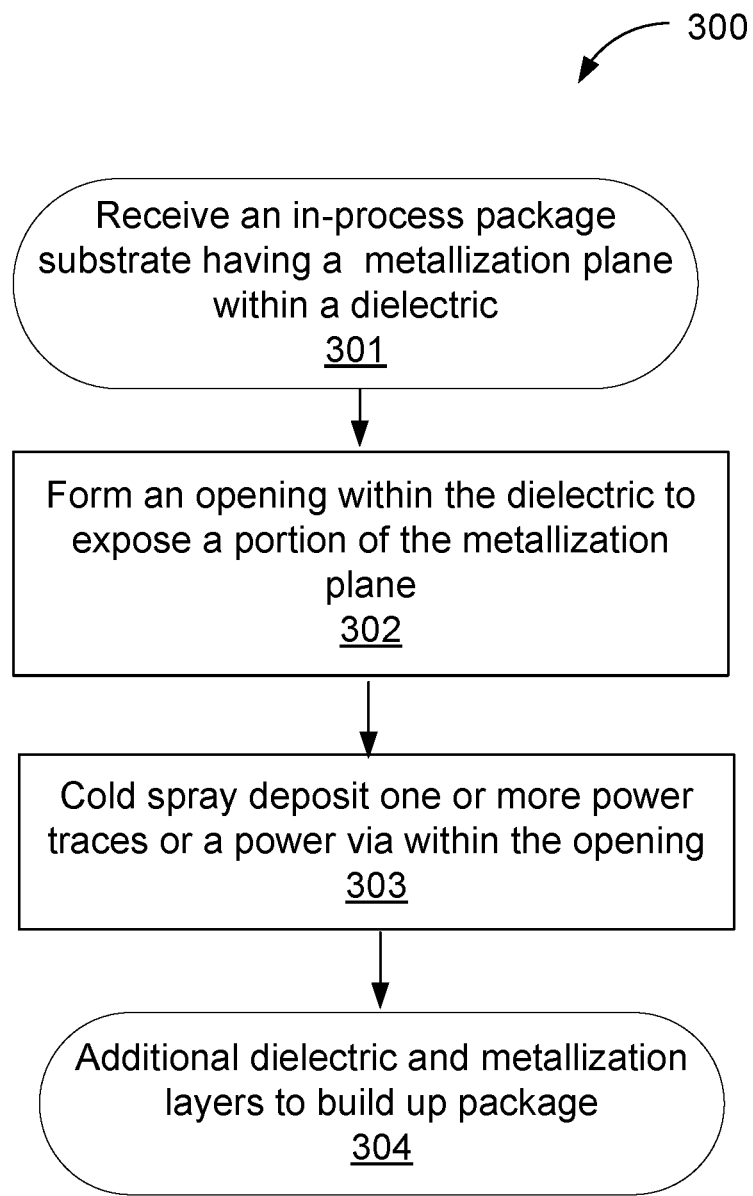
FIG. 3 illustrates a flow chart summarizing an exemplary method for making a package substrate comprising a low-resistance HTAM power via, according to some embodiments of the disclosure.

FIG. 3 illustrates flow chart 300 summarizing an exemplary method for making a package substrate comprising a low-resistance HTAM power via, according to some embodiments of the disclosure.

At operation 301, a partial package substrate similar to package substrate of operation 101 and described above is received in-process for fabrication of low-resistance HTAM power vias by a cold spray process.

At operation 302, one or more large holes for low resistance power via may be formed in the package dielectric material for subsequent backfilling by HTAM metallization. In intermediate stages of package substrate fabrication, low-resistance power via holes may be formed by mechanical or laser drilling into the open surface of the dielectric material. For example, holes may be drilled for low-resistance power vias before electroplating of conductor features over the open dielectric surface. For a damascene electroplating process that may follow power via formation, the dielectric surface may be patterned with in-plane trace and pad recesses before or after power via holes are drilled.

The low-resistance power via hole(s) may extend to one or more conductor planes already embedded within the dielectric for subsequent interconnection by the low-resistance power via to be formed in the hole(s). Location of the low-resistance power via holes may be aligned with buried landing pads, where the landing pads may provide stops for a laser drill so that the holes do not penetrate deeper than the intended level. The landing pads may be coupled electrically to other metallization within the lower conductor plane(s).

At operation 303, power via holes are backfilled with HTAM metallization through a cold spray powder deposition. For example, HTAM power vias may be formed by cold spray deposition of a powder comprising copper or another suitable material as described above for formation of low-resistance power traces. As noted above, a supplemental material (derived from a powder) may be deposited by a HTAM cold spray process to depths of hundreds of microns within seconds, whereas electroplating copper vias of similar size may require hours to complete.

HTAM power vias may be formed by powder deposition through a shadow mask having lithographically defined features, or by a direct-write process employing one or more micronozzles. After the completion of the cold spray operation, some overburden or excess material may be present on and adjacent to the tops of the low-resistance power vias at the substrate surface. A planarization operation (e.g., chemical mechanical polishing, CMP) may be performed to remove the excess supplemental material and prepare the surface for subsequent electroplating and/or dielectric lamination in operation 304.

FIGS. 4A-4G illustrate operational cross-sectional views in the x-z plane of an exemplary method as outlined in FIG. 3 for fabricating package substrate 400 comprising HTAM low-resistance power vias, according to some embodiments of the disclosure.

Figure 4A:
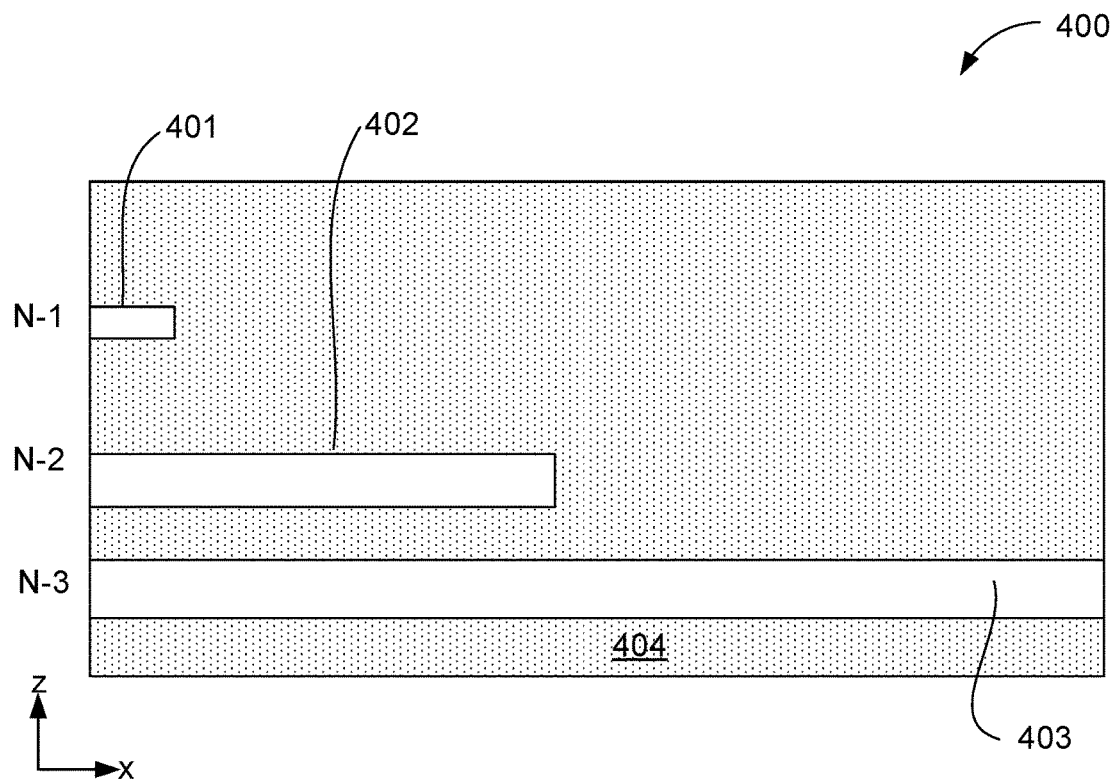
FIGS. 4A-4G illustrate operational cross-sectional views in the x-z plane of an exemplary method as outlined in FIG. 3 for fabricating a package substrate comprising HTAM low-resistance power vias, according to some embodiments of the disclosure.

In FIG. 4A, package substrate 400 is shown at an intermediate to late stage of fabrication, comprising formation of low-resistance power vias by an HTAM process. In the illustrated embodiment, package substrate comprises traces 401, 402 and 403 in adjacent conductor planes (in descending order) N-1, N-2 and N-3, respectively, embedded within dielectric 404. Additional conductor planes may be present below level N-3 (e.g., N-4, N-5, etc.). Traces 401-403 have thicknesses ranging between 10 and 50 microns. Traces 402 and 403 may be located several hundred microns within dielectric 404 below terminal surface 405. In some embodiments, traces 402 and 403 are power traces, which may have larger critical dimensions (e.g., thickness or width) larger than traces (e.g., trace 401) made for small signals (e.g., I/O data).

In some embodiments, package substrate 400 comprises a core (not shown). In some embodiments, power planes on opposite sides of the package core may be interconnected by HTAM power through-vias and/or copper plug inserts extending through the core (described below).

Figure 4B:
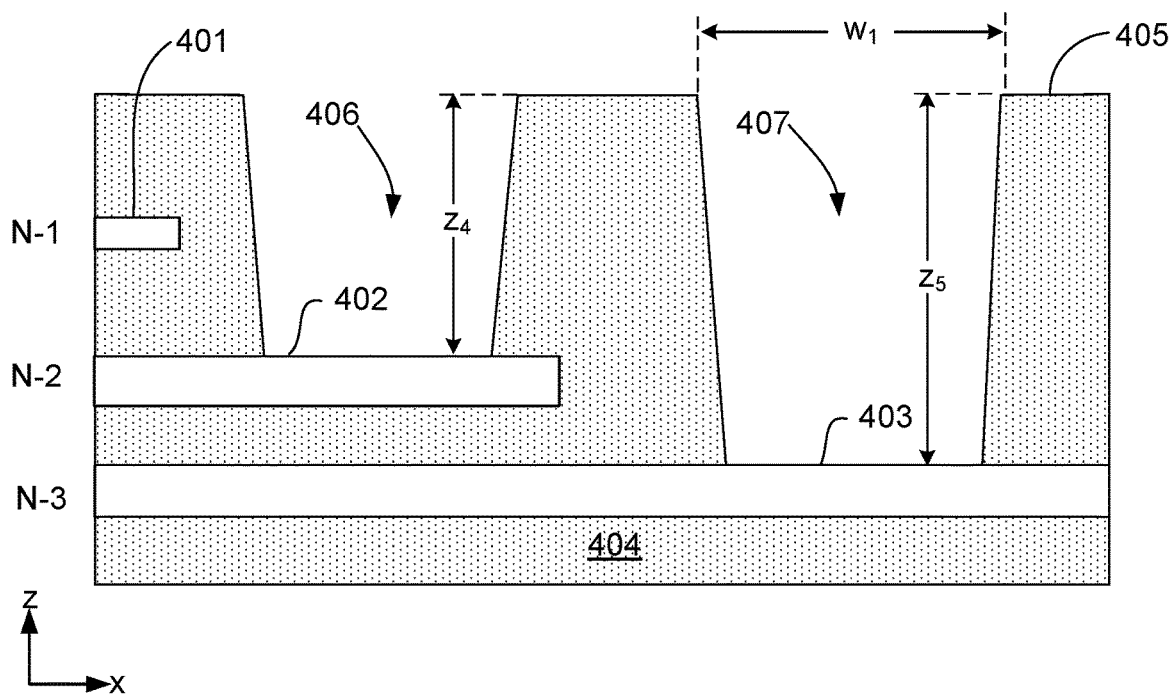

Referring to FIG. 4B, terminal surface 405 is prepared for formation of a top level copper conductor plane (e.g., conductor plane N, FIG. 4D) in a subsequent operation. Prior to electroplating features over dielectric surface 405, power via holes 406 and 407 may be formed by a laser or mechanical drilling operation between surface 405 and embedded power planes N-2 and N-3 at depths $z_4$ and $z_5$, respectively. For example, power via holes 406 and 407 may be formed by laser drilling to traces 402 and 403, respectively. The locations of power via holes 406 and 407 may be aligned over landing pads (not shown) at depths $z_4$ and $z_5$, respectively. Landing pads may also provide laser stops for the laser drilling process.

Power via holes 406 and 407 may have both low and high aspect ratios. In some embodiments, power via holes may have z-heights of several hundred microns, extending through a substantial thickness of the package substrate. Likewise, power via holes may also have diameters $w_1$ reaching several hundred microns. In some embodiments, low-resistance power vias may have larger aspect ratios. Because of the low deposition rates, via holes for electroplated vias may have z-heights of 100 microns or less.

Figure 4C:
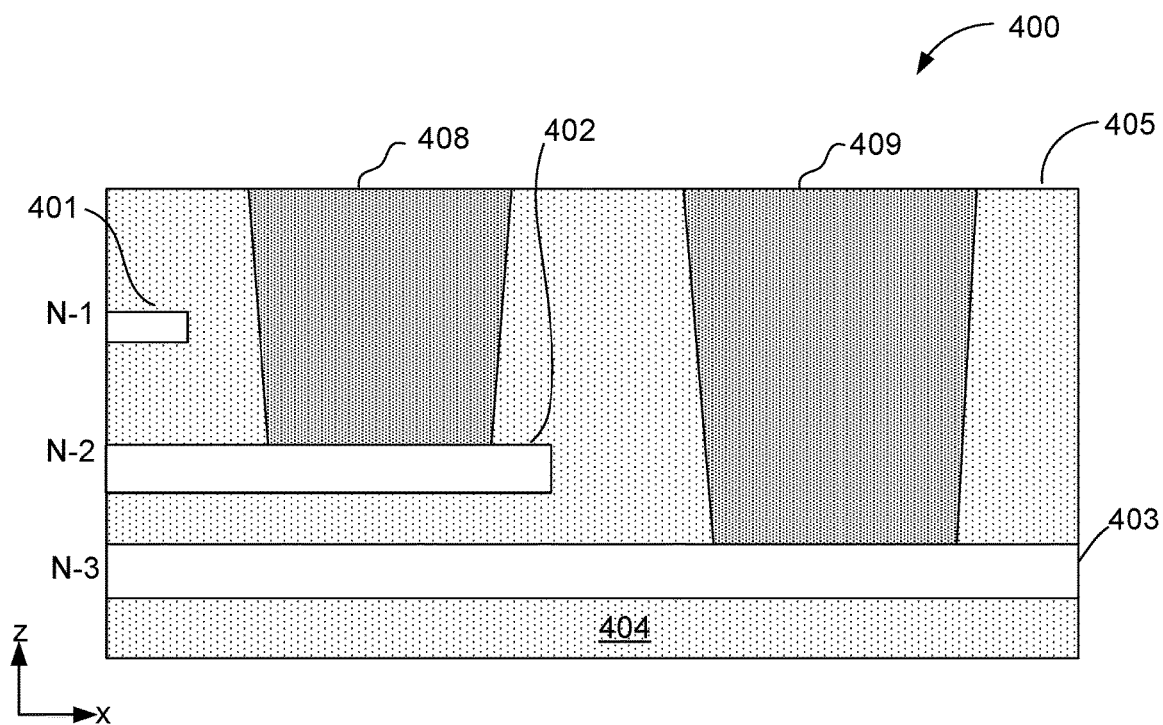

Referring to FIG. 4C, power via holes 406 and 407 may be backfilled by HTAM metallization in a subsequent cold spray operation for creation of low-resistance HTAM power vias 408 and 409. As noted above, a shadow mask or direct write method may be employed to guide the cold spray deposition into via holes (e.g., power via holes 406 and 407). A planarization operation such as CMP may be performed after deposition of the HTAM metallization to remove excess supplemental material (e.g., overburden) from the tops of HTAM power vias 408 and 409, as well as from surface 405 of dielectric 404. This may also be performed to planarize the surface and enable high resolution lithography for forming the next metal layers.

Figure 4D:
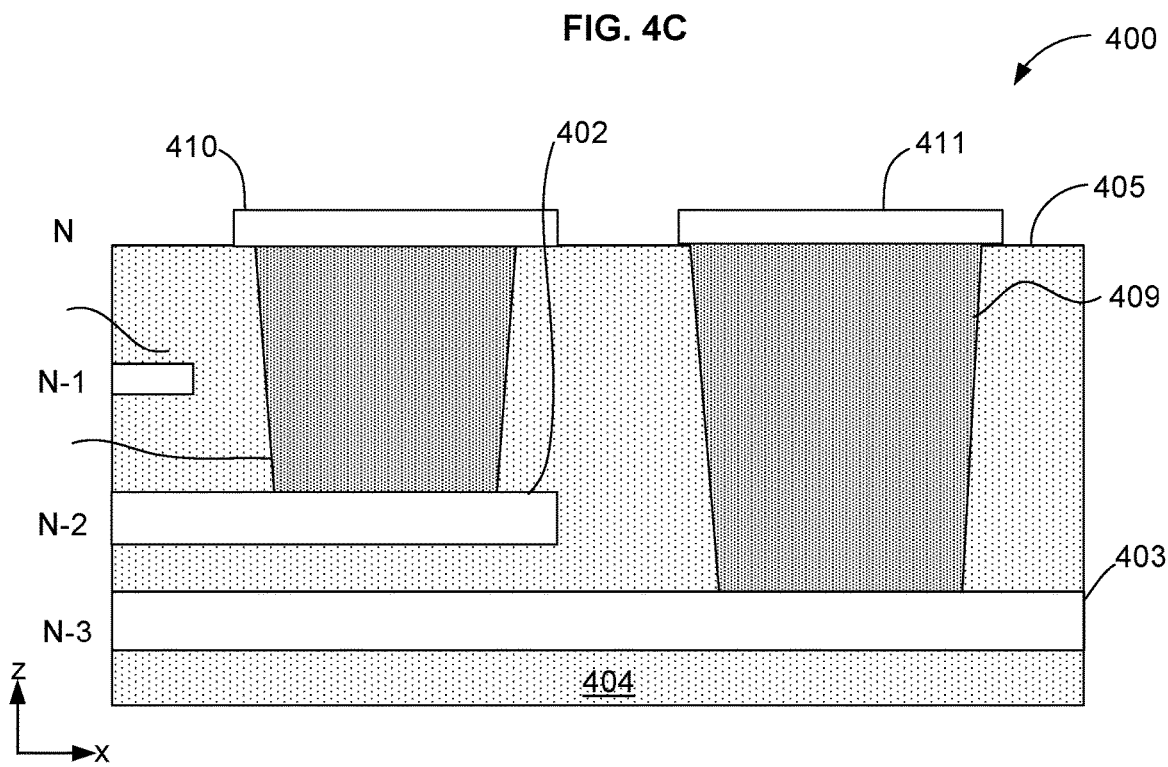

Referring to FIG. 4D, low resistance power vias 408 and 409 may interconnect power traces 402 and 403 to pads 410 and 411 (e.g., in a LGA) formed in top level conductor plane N on the terminal surface 405 of dielectric 404. Pads 410 and 411 may be electroplated over the tops of HTAM low-resistance power vias 408 and 409 to thicknesses up to 30 microns, capping the HTAM metallization with an electroplated layer of a suitable metal such as, but not limited to, copper or gold. Power traces 402 and 403 may be employed as Vss and Vdd rails in a system implementation, for example, coupled to a printed circuit board mounted socket (not shown) through LGA power pads (e.g., pads 410 and 411).

Figure 4E:
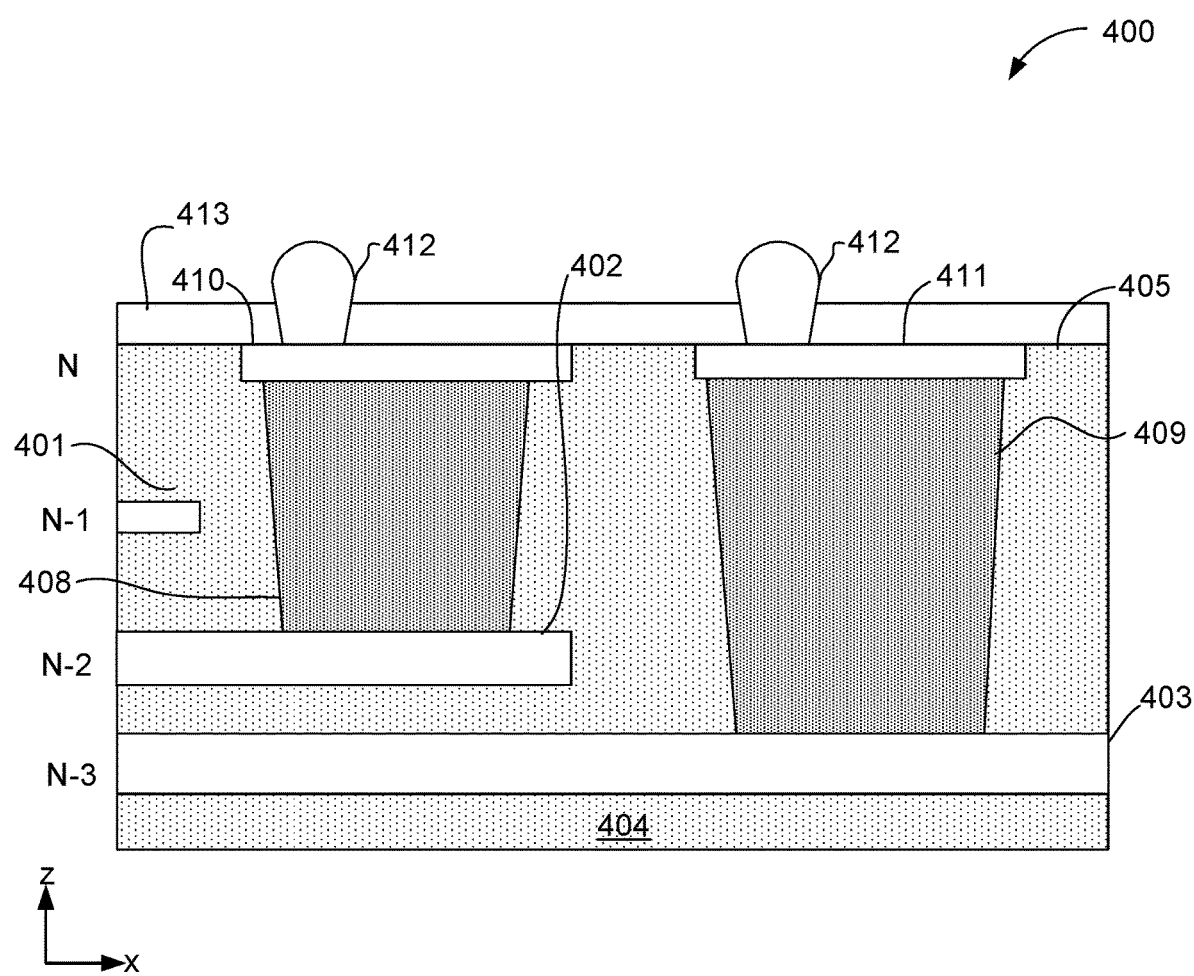

Referring to FIG. 4E, solder balls 412 may be patterned through solder mask 413 on pads 410 and 411. Solder balls 412 may be incorporated within a ball grid array (BGA) formed on surface 405 of package substrate 400. For example, HTAM power traces 402 and 403 may be employed as Vss and Vdd rails coupled to the BGA through pads 410 and 411.

Figure 4F:
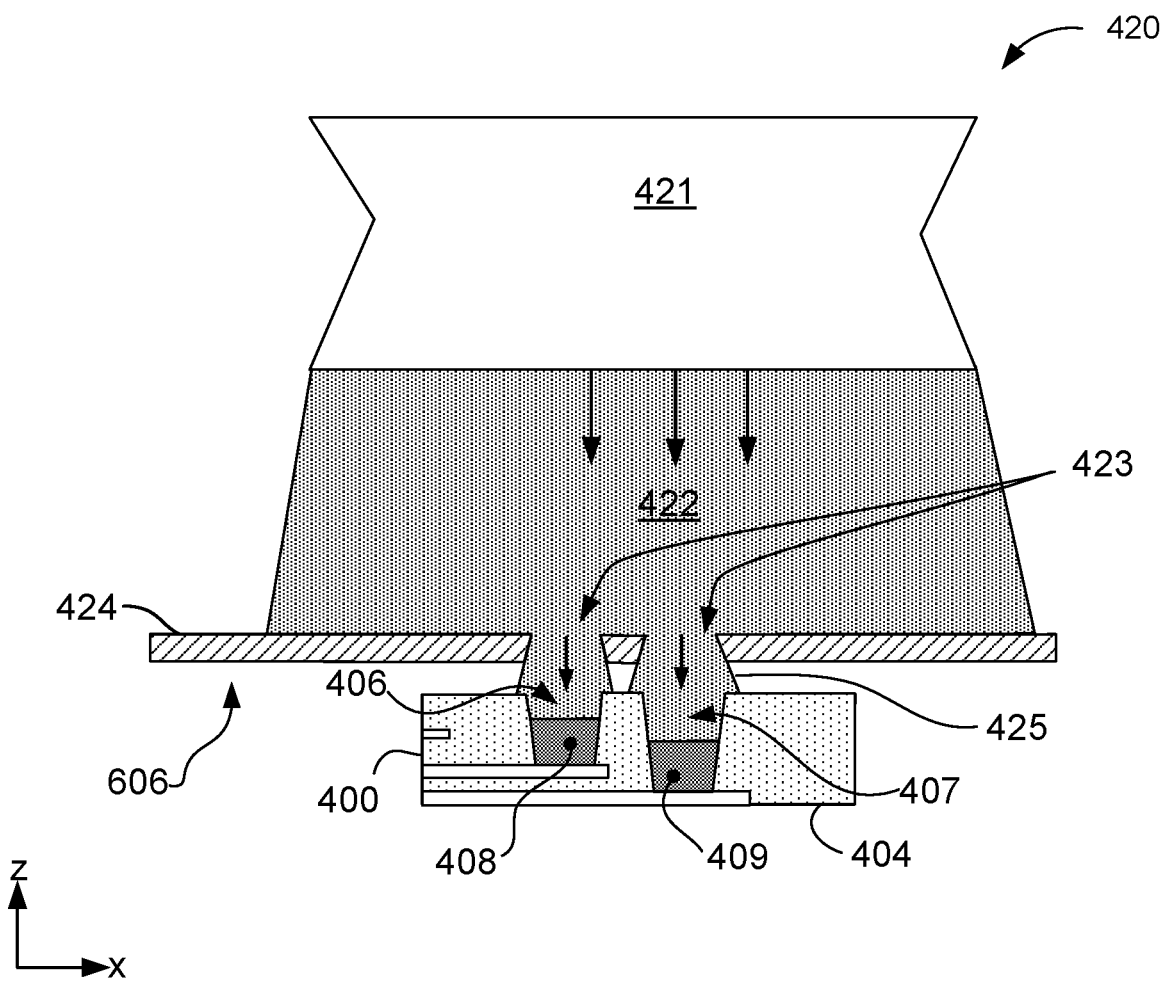

FIG. 4F shows an exemplary cold spray apparatus 420 that may be employed to fabricate HTAM metallization structures 205. In particular, the front end of cold spay apparatus 420 is shown, comprising single nozzle 421. Cold spray jet 422 is formed from a high-velocity non-reactive gas passing through nozzle 421, carrying an entrained powder. Free powder particles may be quasi-spherical or oval shaped, and may also include angular and jagged shapes, ranging in diameter between 1 and 50 microns. Gases may be expanded out of nozzle 421 (or micronozzle 431 shown in FIG. 4G) from upstream pressures above 2 MPa (e.g., above 20 atmospheres) to atmospheric pressure, causing entrained particles to reach high velocities (e.g., between 5000 and 10000 m/s). Cold spray jet 422 may comprise nitrogen, air, argon or helium heated to temperatures between approximately 25° C. and 500° C. Jet and particle velocities may be adjusted during the process to equal or exceed a critical velocity beyond which particles plastically deform upon impact and adhere to a substrate or to each other in the top layer of the coating formed by build-up of sprayed particles. As the critical velocity depends on the material composing the coating, particles may be driven at velocities ranging between approximately 500 and 1000 m/s. Pressurized gases may be preheated upstream of nozzle 421 to the above-noted temperature range primarily to avoid liquefaction upon expansion.

Apertures 423 of shadow mask 424 may be aligned to via openings 406 and 407. Powder particles within jet 422 may travel in substantially straight lines along a narrow band of off-axis angles within a divergent jet cone. Jet 422 may be a broad cone, whereby the width of jet 422 may depend mostly on the diameter of nozzle 421. Narrow streams 425 of material pass through apertures 423 and deposit supplemental material within via holes 406 and 407 to form HTAM power vias 408 and 409. In the illustrated embodiment, HTAM power vias 408 and 409 are shown in-process as growing structures. Growth of the HTAM power vias 408 and 409 may take place at a rate of 20-40 microns/second, for example.

Figure 4G:
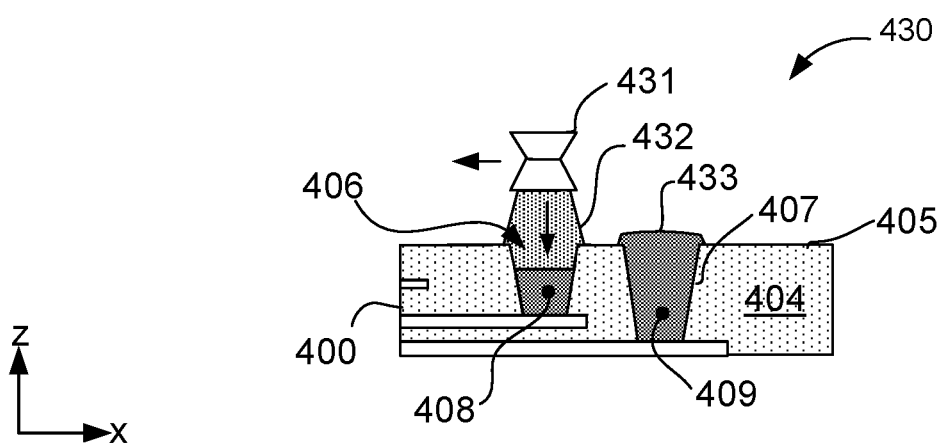

FIG. 4G illustrates a direct-write cold spray apparatus comprising a mobile micronozzle 431 that may translate over package substrate 400 to deposit supplemental within apertures (e.g., via holes 406 and 407, or trenches 204 as shown in FIG. 2B) formed within dielectric 404. Micronozzle 431 may be part of an array of micronozzles for multiple simultaneous depositions. Micronozzle 431 may form jet 432 small enough to be directed into via holes 406 and 407 without the aid of a shadow mask. Fine HTAM metallization features may be created by micronozzle deposition. Deposition rates of the powder comprising the supplemental material may be substantially the same as for the macronozzle process described above (e.g., generally 20-40 microns per second). In the illustrated embodiment, micronozzle 431 is depicted travelling toward the left of the figure. HTAM power via 408 is in the process of being fabricated, whereby supplemental material is being deposited into via hole 406. In the illustrated embodiment, fabrication of HTAM power via 409 is completed by the backfilling of via hole 407 with an excess of supplemental material, creating an overburden 433 that extends above and over surface 405 of dielectric 404. Overburden may be removed by a post-deposition CMP planarization operation.

In some embodiments, single or multiple micronozzles 431 may be mounted on a gantry system (not shown), where individual micronozzles 431 may translate (e.g., in the x-direction of the figure as indicted by the arrow) along package substrate 400 to spray-deposit supplemental material to form HTAM power vias 408 and 409 as the micronozzle(s) is(are) displaced. In some embodiments, two-dimensional arrays of stationary micronozzles 608 may comprise multiple stationary micronozzles 431 positioned along package substrate 400 for simultaneous deposition of supplemental material into multiple apertures.

Figure 5A:
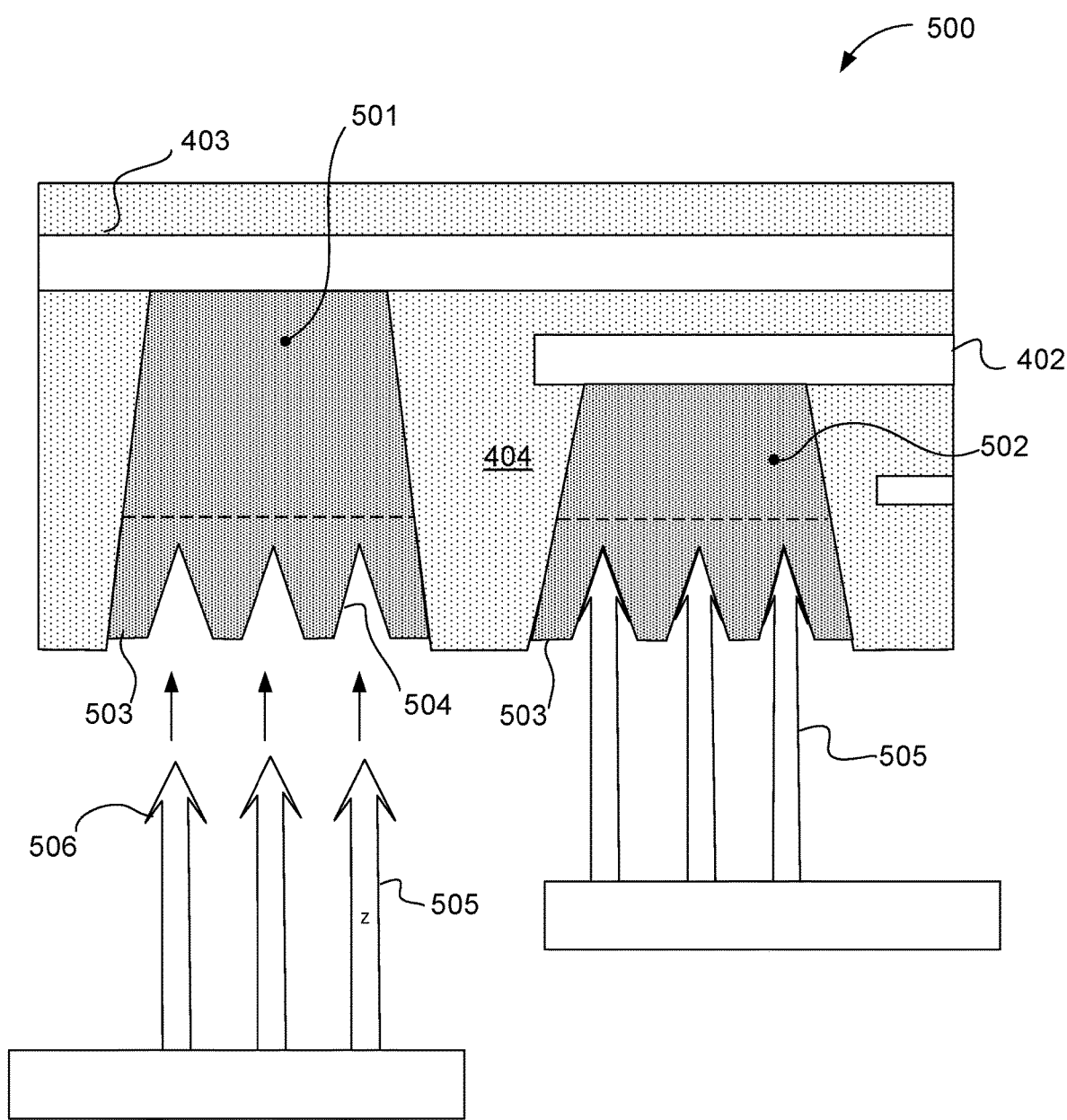
FIG. 5A illustrates a cross-sectional view in the x-z plane of a package substrate comprising HTAM low-resistance power vias having recessed integrated land pads, according to some embodiments of the disclosure.

FIG. 5A illustrates a cross-sectional view in the x-z plane of package substrate 500, comprising HTAM low-resistance power vias having recessed integrated land pads for reducing contact resistance with mating socket pins, according to some embodiments of the disclosure.

Package substrate 500 has an architecture similar to package substrate 400 shown in FIG. 4E, comprising power traces 402 and 403 within dielectric 404. In package substrate 500, HTAM metallization in power vias 501 and 502 extends to surface 405 of dielectric 404, terminating at land contact surfaces 503. In some embodiments, land contact surfaces 503 comprise HTAM metallization (e.g., supplemental material) that is integral with the supplemental material of HTAM power vias 501 and 502. Land contact surfaces 503 may be planar or have recesses, described in detail below. In some embodiments, the land contact pads are exposed supplemental material from HTAM power via metallization extending to the exterior surfaces (e.g., terminal surface 405) of package substrate 500 (without an intervening copper layer, as in shown in FIGS. 4D and 4E for package substrate 400).

Land contact surfaces 503 may be non-planar, as shown in the figure, comprising recesses 504 that may be shaped to complement socket pin tip shape. For example, power pins in CPU sockets may have curled or conical tips or employ other three-dimensional structures. Recess geometries may complement these shapes. As a result, the contact surface area between power pin and via may be increased significantly. The increased contact area reduces contact resistance between mating surfaces. Decreased contact resistance may by consequence also reduce socket-package mounting forces required to obtain adequate electrical contact. Mating socket pins 505 having conical tips 506 are shown in FIG. 5A. Arrows indicate the insertion of the conical tips 506 of socket pins 505 into mating recesses 504.

3D structuring of contact surfaces 503 may be performed during the final stages of a cold spray deposition of low-resistance power vias (e.g., low-resistance power vias 406 and 407). For example, recesses 504 may be formed by high-precision cold spray deposition (e.g., a direct write process) of supplemental material through a fine micronozzle, a drilling operation or chemical back-etch of the HTAM metallization at contact surfaces 503. In the illustrated embodiment, recesses 504 are conical. Other suitable recessed 3D shapes are also possible, such as, but not limited to, shapes comprising hemispherical, parabolic or rectilinear (e.g. cubical) contours.

HTAM power vias 501 and 502 may have substantially the same dimensions as low-resistance HTAM power vias described earlier (e.g., low-resistance HTAM power vias 406 and 407). The low bulk resistance of HTAM power vias may be combined with the low contact resistance afforded by recesses 504 to provide a fully HTAM power conductor having substantially lower resistance than conventional electroplated conductors.

Figure 5B:
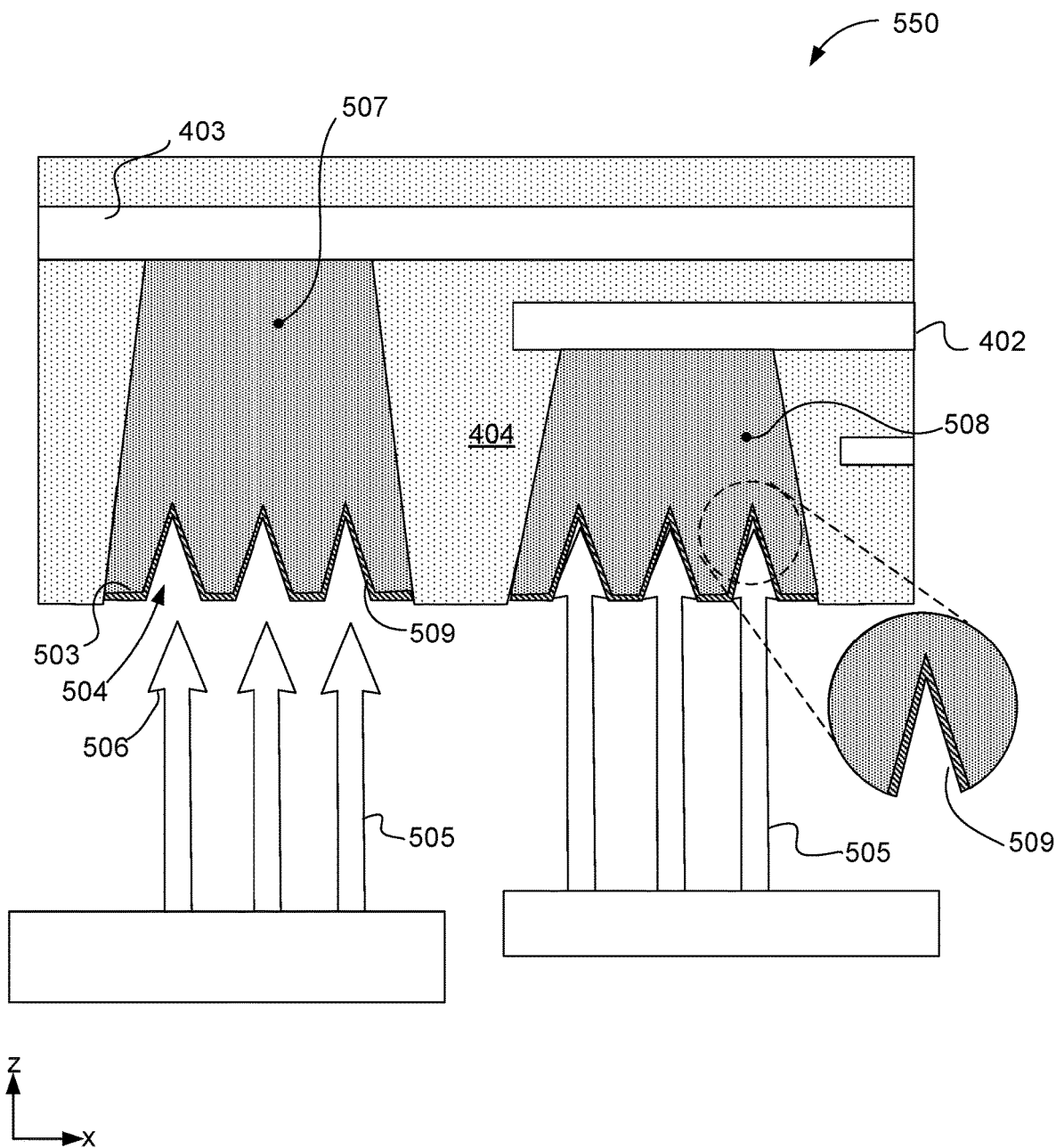
FIG. 5B illustrates a cross-sectional view in the x-z plane of a package substrate comprising HTAM low-resistance power vias of FIG. 5A having a surface finish within the integrated recesses, according to some embodiments of the disclosure.

FIG. 5B illustrates a cross-sectional view in the x-z plane of package substrate 550, comprising HTAM low-resistance power vias of FIG. 5A having a surface finish within the integrated recesses for further reducing contact resistance with mating socket pins, according to some embodiments of the disclosure.

Package substrate 550 has an architecture substantially similar to package substrate 500. Package substrate 550 comprises HTAM power vias 507 and 508 that may be substantially the same as HTAM power vias 501 and 502, respectively. In package substrate 550, HTAM power vias 507 and 508 comprise a surface finish 509 within recesses 504. Surface finish 509 may comprise a layer (having a thickness of 10 microns, for example) of a suitable malleable and/or ductile electrically conductive material covering walls of recesses 504. Suitable materials for formation of surface finish 509 may include indium, gallium, tin, gold, silver, aluminum, copper, zinc, iron, or an alloy comprising any of the afore-mentioned metals and other materials not listed.

As noted above, surface finish 509 may be softer than the bulk supplemental material of HTAM power vias 507 and 508, having a lower bulk modulus than the supplemental material. The malleable and/or ductile surface finish may further increase contact area between mating tip 506 of socket pin 505 and recess 504 by plastic deformation under stress, causing the malleable layer to extrude and mold around the tip 506 of and may fill any gaps between tip 506 and supplemental material.

Figure 5C:
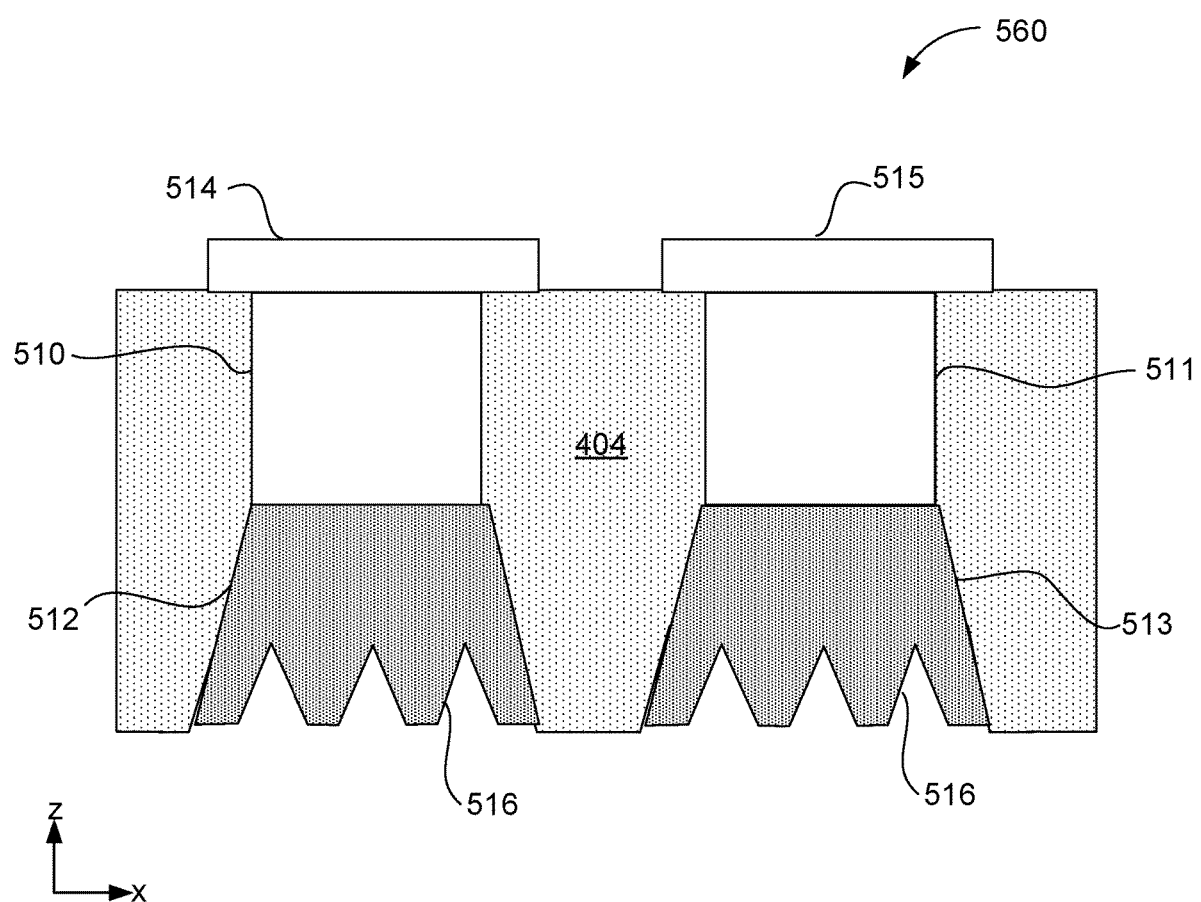
FIG. 5C illustrates a cross-sectional view in the x-z plane of a package substrate comprising HTAM low-resistance power vias of FIG. 5A integrated with copper plugs extending through the substrate to die side power contacts, according to some embodiments of the disclosure.

FIG. 5C illustrates a cross-sectional view in the x-z plane of package substrate 560, comprising HTAM low-resistance power vias of FIG. 5A integrated with metal plugs extending through the substrate to die side power contacts, according to some embodiments of the disclosure.

Package substrate 560 comprises copper plugs 510 and 511 extending through dielectric 404 between HTAM power vias 512 and 513 and die-side power contact pads 514 and 515. Metal (e.g., copper) plugs 510 and 511 may be electrically coupled to HTAM power vias 512 and 513 and to power contact pads 514 and 515, respectively. In the illustrated embodiment, HTAM power vias 512 and 513 comprise conical recesses 516. In some embodiments, HTAM power vias 512 and 513 have a planar contact surface. Metal plugs 510 and 511 may be pre-manufactured structures that are inserted into openings made in dielectric 404. For example, copper plugs 510 and 511 may be inserted by a pick-and-place operation into pre-drilled holes made within dielectric 404. HTAM power vias 512 and 513 may be formed within the hole after insertion of metal plugs 510 and 511 such that HTAM power vias 512 and 513 abut metal plugs 510 and 511. In alternative embodiments, a first hole may be drilled, wherein HTAM power vias 512 and 513 may be formed within dielectric 404. A second hole may be drilled over HTAM power vas 512 and 513, followed by insertion of metal plugs 512 and 513. Copper pads 514 and 515 may be formed by electroplating over metal plugs 512 and 513.

Figure 6:
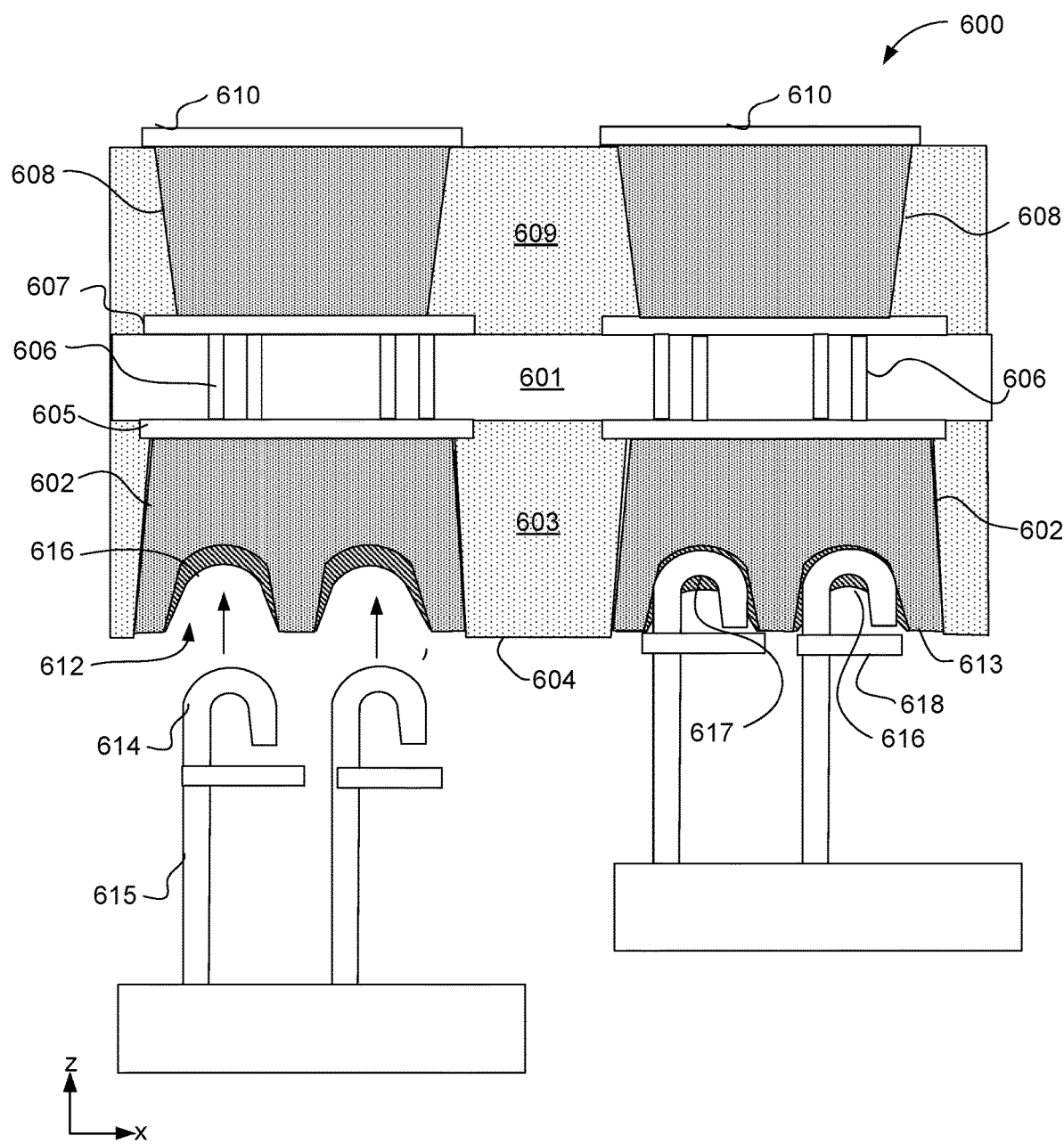
FIG. 6 illustrates a cross-sectional view in the x-z plane of a package substrate comprising HTAM low-resistance power vias of FIG. 5A having a liquid metal within the integrated recesses, according to some embodiments of the disclosure.

FIG. 6 illustrates a cross-sectional view in the x-z plane of package substrate 600, comprising HTAM low-resistance power vias of FIG. 5A having a liquid metal within the integrated recesses for further reducing contact resistance with mating socket pins, according to some embodiments of the disclosure.

Package substrate 600 may be a cored package, for example, comprising package core 601. HTAM power vias 602 extend through the backside of package core 601 within dielectric 603 between backside surface 604 and landing pad 605 on the backside surface of package core 601. Through-vias 606 extend through package core 601 from the backside landing pad 605 to frontside landing pad 607. Through-vias 606 may electrically couple HTAM power vias 602 to HTAM power vias 608, extending through dielectric 609 to contact pad 610 on front side surface 611. Front-side contact pads 610 may couple to power circuitry in an attached IC die (not shown).

HTAM power vias 602 comprise recesses 612 on contact surfaces 613. Recesses 612 may have any suitable 3D shape, including conical as shown in FIGS. 5A and 5B. In the illustrated embodiment, recesses 612 may have a hemispherical or slot shape that may be complementary to the curled cross-sectional shape of tips 614 (tips 614 may also have a hemispherical 3D shape, for example) of socket pins 615 to decrease contact resistance.

A conductive liquid metal film 616 contained by surface tension within recesses 612 may further decrease contact resistance between socket pin 615 and HTAM power vias 602. The liquid metal film 616 may partially or completely fill recesses 612, having a thickness between 10 and 100 microns. In some embodiments, liquid metal film 616 has a melting temperature between −20° C. and +25° C., and comprises gallium, indium, tin, and eutectic alloys comprising any of the afore-mentioned materials and materials not listed. Insertion of pin tip 614 may cause shear in liquid metal film 616, forcing it to flow around wettable portions of tip 614, as shown on the right side of the figure. Liquid metal may contact portions of tip 614 that normally would be hidden from the recess surface, such as the reverse side 617 of tip 614, substantially lowering contact resistance to socket pins 615.

Socket pins 615 may further include ledge 618 to contain liquid metal that may overflow or detach from recesses 612.

Figure 7A:
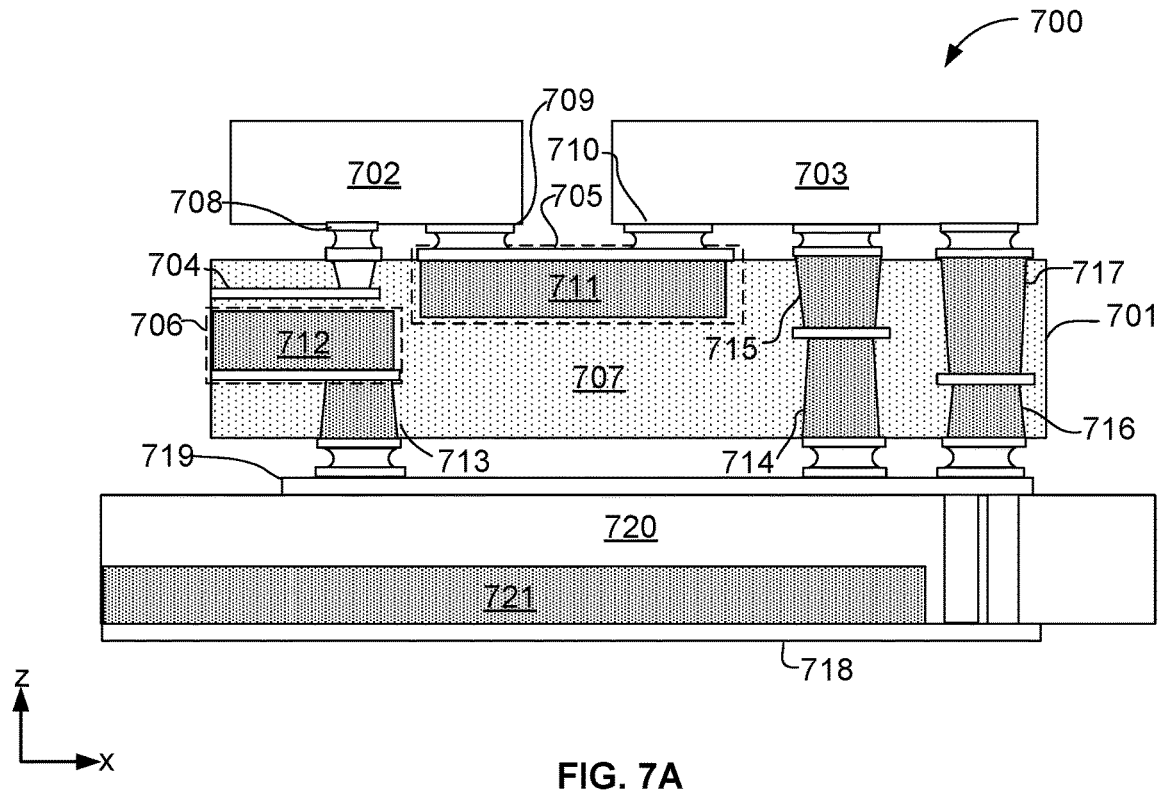
FIG. 7A illustrates a cross-sectional view in the x-z plane of an IC package comprising a package substrate having low-resistance HTAM power vias and HTAM power traces electrically coupled to dies, according to some embodiments of the disclosure.

FIG. 7A illustrates a cross-sectional view in the x-z plane of IC package 700, comprising package substrate 701 electrically coupled to dies 702 and 703. Package substrate 701 comprises low-resistance HTAM power vias and HTAM power traces, according to some embodiments of the disclosure.

In the illustrated embodiment, dies 702 and 703 are coupled to power and signal metallization within package substrate 701, including signal trace 704 and low-resistance HTAM power traces 705 and 706 (delineated by dashed enclosures) within dielectric 707. Die 702 is coupled to signal trace 704 through die signal pad 708. Both of dies 702 and 703 may be electrically coupled to HTAM power trace 705 for conveyance of power between the two dies (e.g., from die 703 to die 702). For example, die 702 may be a microprocessor and die 703 may be a voltage regulator. Both power input pad 709 on microprocessor die 702 and output pad 710 on regulator die 702 may be solder bonded to HTAM power trace 706, as shown. HTAM power traces 705 and 706 may comprise HTAM metallization layers 711 and 712, respectively. HTAM metallization layers have been described above. According to some embodiments, HTAM metallization layers 711 and 712 comprise a suitable supplemental material such as cold-sprayed copper. HTAM metallization layers 711 and 712 may have thicknesses ranging between 100 and 500 microns to enable a large current carrying capacity for HTAM power traces 705 and 706. For example, HTAM power trace 705 may carry currents up to 100 amps or greater during microprocessor burst periods.

Low-resistance HTAM power vias 713-717 may couple power rail 718 and ground rail (or ground plane) 719 within PCB 720 to microprocessor die 702 and regulator die 703. Power rail 718 may optionally have HTAM metallization layer 721 incorporated over electroplated copper or etched copper foil.

Figure 7B:
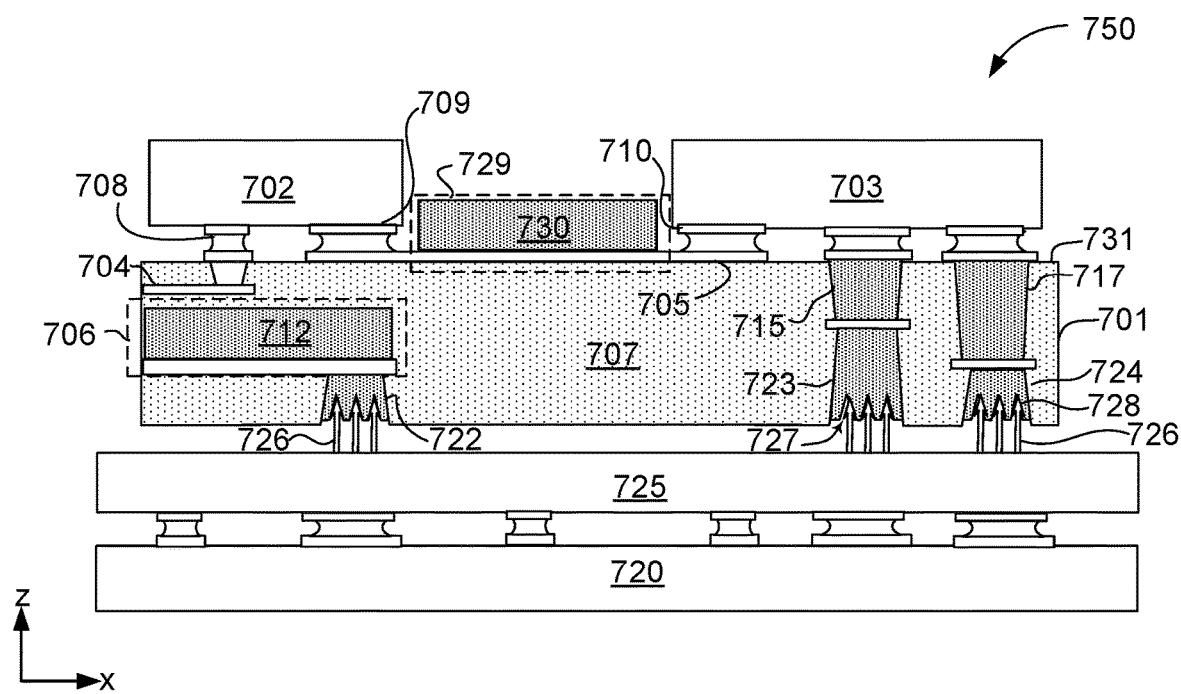
FIG. 7B illustrates a cross-sectional view in the x-z plane of an IC package comprising a package substrate having HTAM power vias and integrated recessed HTAM power traces electrically coupled to dies, according to some embodiments of the disclosure.

FIG. 7B illustrates a cross-sectional view in the x-z plane of IC package 750, comprising package substrate 701 electrically coupled to dies 702 and 703. Package substrate 701 comprises low-resistance HTAM power vias and integrated recessed HTAM power contact pads, according to some embodiments of the disclosure.

In the illustrated embodiment, IC package 750 is substantially similar to IC package 700 shown in FIG. 7A, with the exception of mounting within IC socket 725. Data I/O and power may be coupled to PCB 720 through a LGA comprising HTAM via interconnects 722, 723 and 724 on bottom of dielectric 707. HTAM via interconnects 722-724 comprise conical recesses 727 within which socket pins 726 are engaged. While socket pins 726 are shown to comprise tips 728 having a conical shape in the illustrated embodiment, tips 728 may have any suitable shape (e.g., hemispherical tips 614 in FIG. 6) that may engage with a complementary-shaped recess 727.

Dies 702 and 703 are coupled together through low-resistance HTAM power trace 729, comprising HTAM metallization layer 730 extending over upper surface 731 of dielectric 707, between dies 702 and 703. Low-resistance power trace 729 may be formed by cold-spray deposition of a supplemental material over trace 705 after electroplating of the top conductor plane (e.g., conductor plane N in FIG. 4D).

Figure 8:
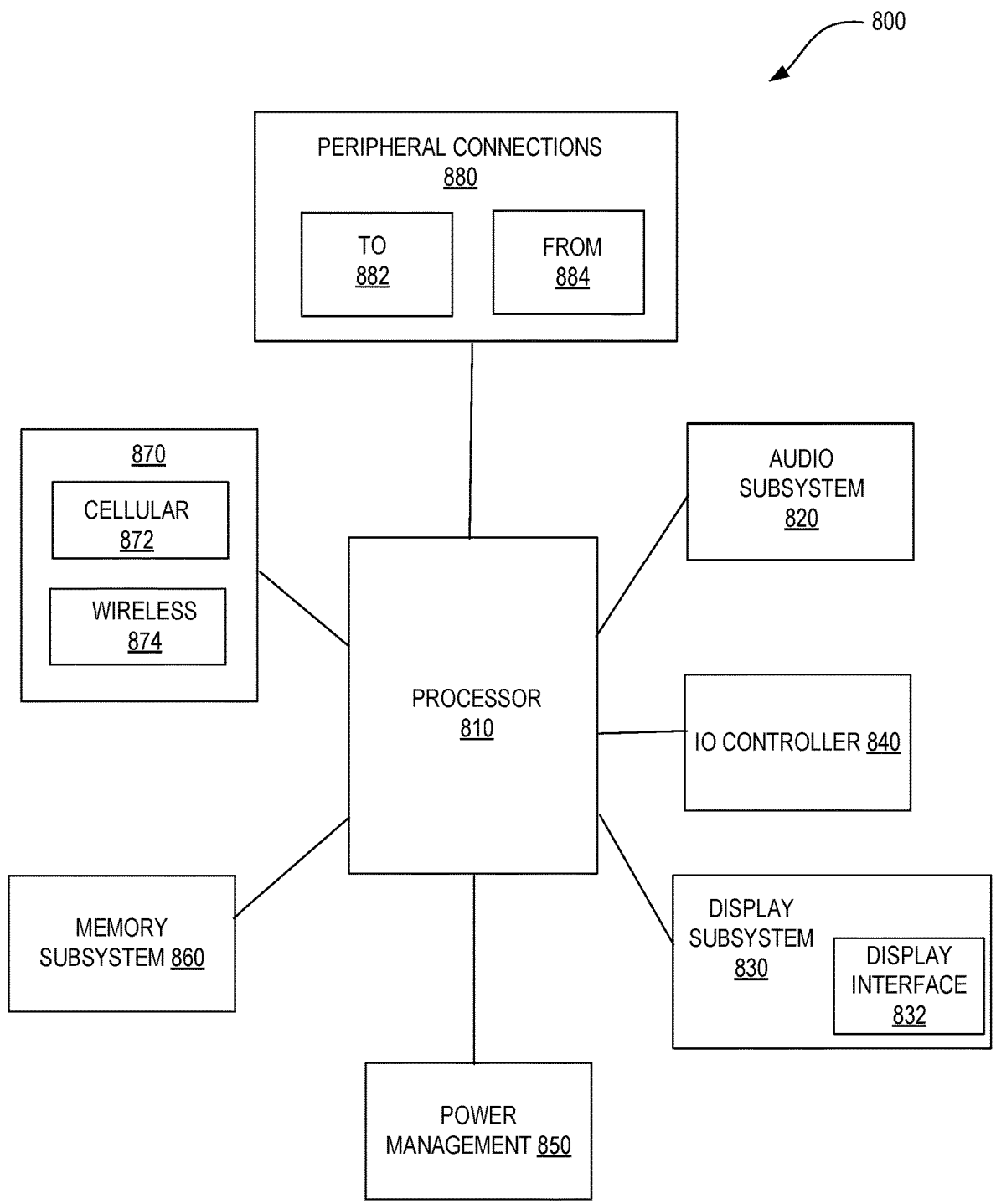
FIG. 8 illustrates a block diagram of computing device 800 as part of a system-on-chip (SoC) package in an implementation of IC packages comprising low-resistance HTAM power conductors, according to some embodiments of the disclosure.

FIG. 8 illustrates a block diagram of computing device 800 as part of a system-on-chip (SoC) package in an implementation of IC packages comprising low-resistance HTAM power conductors, according to some embodiments of the disclosure.

According to some embodiments, computing device 800 represents a server, a desktop workstation, or a mobile workstation, such as, but not limited to, a laptop computer, a computing tablet, a mobile phone or smart-phone, a wireless-enabled e-reader, or other wireless mobile device. An IC package, such as, but not limited to, a single- or multi-core microprocessor (e.g., representing a central processing unit) comprises a package substrate having low-resistance HTAM power conductors formed by cold spray deposition, for example. Examples include package substrates 200 and 400 as disclosed herein.

In some embodiments, computing device has wireless connectivity (e.g., Bluetooth, WiFi and 5G network). It will be understood that certain components are shown generally, and not all components of such a device are shown in computing device 800.

The various embodiments of the present disclosure may also comprise a network interface within 870 such as a wireless interface so that a system embodiment may be incorporated into a wireless device, for example, cell phone or personal digital assistant. The wireless interface includes a millimeter wave generator and antenna array. The millimeter wave generator may be part of a monolithic microwave integrated circuit.

According to some embodiments, processor 810 represents a CPU or a GPU, and can include one or more physical devices, such as microprocessors, application processors, microcontrollers, programmable logic devices, or other processing means. Processor 810 may comprise customizable microfluidic heat spreader (e.g., customizable microfluidic heat spreader 100, 200, 300 or 400) as disclosed. The processing operations performed by processor 810 include the execution of an operating platform or operating system on which applications and/or device functions are executed. The processing operations include operations related to I/O (input/output) with a human user or with other devices, operations related to power management, and/or operations related to connecting the computing device 800 to another device. The processing operations may also include operations related to audio I/O and/or display I/O.

In one embodiment, computing device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 800, or connected to the computing device 800. In one embodiment, a user interacts with the computing device 800 by providing audio commands that are received and processed by processor 810

Display subsystem 830 represents hardware (e.g., display devices) and software (e.g., drivers) components that provide a visual and/or tactile display for a user to interact with the computing device 800. Display subsystem 830 includes display interface 832 which includes the particular screen or hardware device used to provide a display to a user. In one embodiment, display interface 832 includes logic separate from processor 810 to perform at least some processing related to the display. In one embodiment, display subsystem 830 includes a touch screen (or touch pad) device that provides both output and input to a user.

I/O controller 840 represents hardware devices and software components related to interaction with a user. I/O controller 840 is operable to manage hardware that is part of audio subsystem 820 and/or display subsystem 830. Additionally, I/O controller 840 illustrates a connection point for additional devices that connect to computing device 800 through which a user might interact with the system. For example, devices that can be attached to the computing device 800 might include microphone devices, speaker or stereo systems, video systems or other display devices, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of the computing device 800. Additionally, audio output can be provided instead of, or in addition to display output. In another example, if display subsystem 830 includes a touch screen, the display device also acts as an input device, which can be at least partially managed by I/O controller 840. There can also be additional buttons or switches on the computing device 800 to provide I/O functions managed by I/O controller 840.

In one embodiment, I/O controller 840 manages devices such as accelerometers, cameras, light sensors or other environmental sensors, or other hardware that can be included in the computing device 800. The input can be part of direct user interaction, as well as providing environmental input to the system to influence its operations (such as filtering for noise, adjusting displays for brightness detection, applying a flash for a camera, or other features).

In one embodiment, computing device 800 includes power management 850 that manages battery power usage, charging of the battery, and features related to power saving operation. Memory subsystem 860 includes memory devices for storing information in computing device 800. Memory can include nonvolatile (state does not change if power to the memory device is interrupted) and/or volatile (state is indeterminate if power to the memory device is interrupted) memory devices. Memory subsystem 860 can store application data, user data, music, photos, documents, or other data, as well as system data (whether long-term or temporary) related to the execution of the applications and functions of the computing device 800.

Elements of embodiments are also provided as a machine-readable medium (e.g., memory 860) for storing the computer-executable instructions. The machine-readable medium (e.g., memory 860) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 870 includes hardware devices (e.g., wireless and/or wired connectors and communication hardware) and software components (e.g., drivers, protocol stacks) to enable the computing device 800 to communicate with external devices. The computing device 800 could be separate devices, such as other computing devices, wireless access points or base stations, as well as peripherals such as headsets, printers, or other devices.

Network interface 870 can include multiple different types of connectivity. To generalize, the computing device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 874 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 880 include hardware interfaces and connectors, as well as software components (e.g., drivers, protocol stacks) to make peripheral connections. It will be understood that the computing device 800 could both be a peripheral device ("to" 882) to other computing devices, as well as have peripheral devices ("from" 884) connected to it. The computing device 800 commonly has a "docking" connector to connect to other computing devices for purposes such as managing (e.g., downloading and/or uploading, changing, synchronizing) content on computing device 800. Additionally, a docking connector can allow computing device 800 to connect to certain peripherals that allow the computing device 800 to control content output, for example, to audiovisual or other systems.

In addition to a proprietary docking connector or other proprietary connection hardware, the computing device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an integrated circuit (IC) die package substrate comprising a first trace upon, or embedded within, a dielectric material, wherein the first trace comprises a first metal; a first via coupled to the first trace, wherein the first via comprises the first metal, a second trace upon, or embedded within, the dielectric material, and a second via coupled to the second trace, wherein at least one of the second trace or the second via comprises a second metal with a different microstructure or composition than the first metal.

Example 2 includes all of the features of example 1, wherein the first trace has a first thickness, the first via has a first diameter; and at least a portion of the second trace has a second thickness, greater than the first thickness, or the second via has a second diameter greater than the first diameter.

Example 3 includes all of the features of example 2, wherein the first metal and the second metal both comprise predominantly Cu, and the second metal has a greater void % area than the first metal.

Example 4 includes all of the features of examples 2 or 3, wherein at least a portion of the second trace has the second thickness and comprises a stack of both the first thickness of the first metal and a third thickness of the second metal.

Example 5 includes all of the features of example 4, wherein the second trace is coupled to the first trace through the first via.

Example 6 includes all of the features of example 5, wherein at least a second portion of the second trace has only the first thickness of the first metal.

Example 7 includes all of the features of any one of examples 2 through 6, wherein the first trace is within a lower-level conductor plane embedded within the dielectric material; the first trace is coupled by the first via to a first one of a first plurality of interconnect features arrayed within an upper-level conductor plane, the second trace is within an upper-level conductor plane, and at least a portion of the second trace has the second thickness, and the second trace extends between a second one of the first plurality of interconnect features and a first one of a second plurality of interconnect features within the upper-level conductor plane.

Example 8 includes all of the features of any one of examples 2 through 7, wherein the second via has the second diameter and comprises the second metal.

Example 9 includes all of the features of example 8, wherein the first trace is within a first lower-level conductor plane embedded within the dielectric material, the first via is between the first trace and a second trace within a second lower-level conductor plane, below the first lower-level conductor plane, and the second via extends from an upper-level conductor plane, over the first lower-level conductor plane, to the second lower-level conductor plane.

Example 10 includes all of the features of example 9, further comprising a third via comprising the second metal, wherein the third via extends from the upper-level conductor plane, to a third lower-level conductor plane, below the second lower-level conductor plane.

Example 11 includes all of the features of any one of examples 8 through 10, wherein the second via extends from a surface on a first side of the substrate to either a lower-level conductor plane or to a discrete metal slug embedded within the substrate.

Example 12 includes all of the features of example 11, wherein a concave surface of the second via is to receive an interconnect pin of a host component.

Example 13 includes all of the features of example 12, wherein the concave surface is substantially conical and wherein the second via further comprises a surface finish in contact with the second metal and the surface finish comprises a third metal having a lower bulk modulus than the second metal.

Example 14 is an electronic device, comprising an integrated circuit (IC) die package substrate comprising a first trace upon, or embedded within, a dielectric material, wherein the first trace comprises a first metal, a first via coupled to the first trace, wherein the first via comprises the first metal; a second trace upon, or embedded within, the dielectric material and a second via coupled to the second trace, wherein at least one of the second trace or the second via comprises a second metal with a different microstructure or composition than the first metal, a first IC die interconnected to a first side of the package substrate, wherein: the first IC die has a signal I/O plane electrically coupled to the first trace; and the first IC die has a power plane electrically coupled to the second trace.

Example 15 includes all of the features of example 14, further comprising a second IC die interconnected to the first side of the package substrate, and wherein the second trace electrically couples together a power plane of each of the first and second IC dies.

Example 16 includes all of the features of examples 14 or 15, wherein the first IC die comprises a voltage regulation circuitry, the second IC die comprises microprocessor circuitry; and the second trace is to convey power output from the voltage regulation circuitry to the power plane of the microprocessor circuitry.

Example 17 includes all of the features of any one of examples 14 through 16, further comprising a printed circuit board (PCB) interconnected to a second side of the package substrate, wherein the second via comprises the second metal and wherein a socket pin of the PCB is embedded within a recess of the second via.

Example 18 is a method for fabricating an integrated circuit (IC) package substrate, the method comprising receiving a substrate, the substrate comprising a first trace upon, or embedded within, a dielectric material and a first via coupled to the first trace, and spray depositing a second trace or second via upon, or embedded within, the dielectric material.

Example 19 includes all of the features of example 18, wherein spray depositing the second trace or second via further comprises laser drilling an opening through a portion of the dielectric material to expose a conductor plane of the package and spray depositing the second metal into the opening.

Example 20 includes all of the features of examples 18 or 19, wherein spray depositing the second via comprises spray depositing the second metal into the opening and forming a concave surface on the second via.

Example 21 includes all of the features of example 20, further comprising depositing a third metal on the concave surface of the second via to form a surface finish in contact with the second metal, wherein the third metal is solid at temperatures above 20° C. and has a bulk modulus that is less than the bulk modulus of the second metal.

Example 22 includes all of the features of examples 20 or 21, further comprising depositing a third metal on the concave surface of the second via to form a surface finish in contact with the second metal, wherein the third metal is liquid at temperatures below 30° C.

Example 23 includes all of the features of any one of examples 19 through 22, wherein spray depositing the second trace or second via further comprises insertion of a discrete metal slug into the opening and spray depositing the second metal into the opening after insertion of the discrete metal slug; or spray depositing the second metal into the opening, wherein the opening is a first opening, and inserting a discrete metal slug into a second opening formed over the second metal, and wherein the discrete metal slug abuts the second metal.

Example 24 includes all of the features of any one of examples 19 through 23, wherein laser drilling an opening through a portion of the dielectric material to expose a conductor plane of the package comprises laser drilling at least one opening over a power trace within the conductor plane to expose at least one portion of the power trace.

Example 25 includes all of the features of example 24, wherein the at least one opening has a z-height of at least 50 microns.

An abstract is submitted with the understanding that it will not be used to limit the scope or meaning of the claims. The following claims are hereby incorporated into the detailed description, with each claim standing on its own as a separate embodiment.

We claim:

1. An integrated circuit (IC) die package substrate comprising:
   a first trace upon, or embedded within, a dielectric material, wherein the first trace comprises a first metal;
   a first via coupled to the first trace, wherein the first via comprises the first metal;
   a second trace upon, or embedded within, the dielectric material; and
   a second via coupled to the second trace, wherein at least one of the second trace or the second via comprises a second metal with a different microstructure or composition than the first metal, wherein the second metal has a greater void % area than the first metal and wherein the second metal has a void % area of at least 0.1%.

2. The IC die package substrate of claim 1, wherein:
   the first trace has a first thickness;
   the first via has a first diameter; and
   at least a first portion of the second trace has a second thickness, greater than the first thickness, or the second via has a second diameter greater than the first diameter.

3. The IC die package substrate of claim 2, wherein the first metal and the second metal both comprise predominantly Cu, and the second metal has a void % area of at least 0.5%.

4. The IC die package substrate of claim 2, wherein the first portion of the second trace comprises a stack of both the first thickness of the first metal and a third thickness of the second metal.

5. The IC die package substrate of claim 4, wherein:
   the first trace is over a second portion of the second trace lacking the second metal; and
   the second metal is laterally adjacent to the first trace.

6. The IC die package substrate of claim 5, wherein the first trace is non-parallel to the second trace, the second portion of the second trace has only the first thickness of the first metal, and wherein:
   the second trace has a first length, the first portion has a second length and the second portion has a third length, larger than a width of the first trace.

7. The IC die package substrate of claim 2, wherein:
   the first trace is within a lower-level conductor plane embedded within the dielectric material;
   the first trace is coupled by the first via to a first one of a first plurality of interconnect features arrayed within an upper-level conductor plane;
   the second trace is within an upper-level conductor plane, and at least a portion of the second trace has the second thickness; and
   the second trace extends between a second one of the first plurality of interconnect features and a first one of a second plurality of interconnect features within the upper-level conductor plane.

8. The IC die package substrate of claim 2, wherein the second via has the second diameter, which exceeds 100 microns in width and depth, and comprises the second metal.

9. The IC die package substrate of claim 8, wherein:
   the first trace is within a first lower-level conductor plane embedded within the dielectric material;
   the first via is between the first trace and a second trace within a second lower-level conductor plane, below the first lower-level conductor plane; and
   the second via extends from an upper-level conductor plane, over the first lower-level conductor plane, to the second lower-level conductor plane.

10. The IC die package substrate of claim 9, further comprising:
    a third via comprising the second metal, wherein the third via extends from the upper-level conductor plane, to a third lower-level conductor plane, below the second lower-level conductor plane.

11. The IC die package substrate of claim 8, wherein the second via extends from a surface on a first side of the substrate to either a lower-level conductor plane or to a discrete metal slug embedded within the substrate.

12. The IC die package substrate of claim 11, wherein the second metal comprises a concave surface recess to receive an interconnect pin of a host component within the recess.

13. The IC die package substrate of claim 12, wherein:
the second via further comprises a surface finish within the recess and in contact with the second metal; and
the surface finish comprises a third metal having a lower bulk modulus than the second metal.

14. An electronic device comprising:
an integrated circuit (IC) die package substrate comprising:
  a first trace upon, or embedded within, a dielectric material, wherein the first trace comprises a first metal;
  a first via coupled to the first trace, wherein the first via comprises the first metal;
  a second trace upon, or embedded within, the dielectric material; and
    a second via coupled to the second trace, wherein at least one of the second trace or the second via comprises a second metal with a different microstructure or composition than the first metal and a greater void % area than the first metal, wherein the second metal has a void % area of at least 0.5%;
a first IC die interconnected to a first side of the package substrate, wherein:
  the first IC die has a signal I/O plane electrically coupled to the first trace; and
  the first IC die has a power plane electrically coupled to the second trace.

15. The electronic device of claim 14, further comprising a second IC die interconnected to the first side of the package substrate, and wherein the second trace electrically couples together a power plane of each of the first and second IC dies.

16. The electronic device of claim 15, wherein:
the first IC die comprises a voltage regulation circuitry;
the second IC die comprises microprocessor circuitry; and
the second trace is to convey power output from the voltage regulation circuitry to the power plane of the microprocessor circuitry.

17. The electronic device of claim 14, further comprising a printed circuit board (PCB) interconnected to a second side of the package substrate, wherein the second via comprises the second metal having a width and a depth exceeding 100 microns, and wherein a socket pin of the PCB is embedded within a recess of the second metal.

* * * * *